United States Patent

Kumakura et al.

[11] Patent Number: 5,566,386
[45] Date of Patent: Oct. 15, 1996

[54] NONVOLATILE SEMICONDUCTOR MEMORY DEVICE HAVING A STATUS REGISTER AND TEST METHOD FOR THE SAME

[75] Inventors: Sinsuke Kumakura; Hirokazu Yamazaki; Hisayoshi Watanabe; Yasushi Kasa, all of Kawasaki, Japan

[73] Assignee: Fujitsu Limited, Kanagawa, Japan

[21] Appl. No.: 471,526

[22] Filed: Jun. 6, 1995

Related U.S. Application Data

[62] Division of Ser. No. 365,847, Dec. 29, 1994, Pat. No. 5,469,394, which is a division of Ser. No. 192,821, Feb. 7, 1994, Pat. No. 5,402,380.

[30] Foreign Application Priority Data

Mar. 17, 1993 [JP] Japan ................................. 5-057135

[51] Int. Cl.⁶ .................................................. G11C 5/14
[52] U.S. Cl. ........................................ 365/226; 365/201
[58] Field of Search ................................. 365/226, 201, 365/189.09, 227, 229

[56] References Cited

U.S. PATENT DOCUMENTS

| | | | |
|---|---|---|---|
| 4,379,259 | 4/1983 | Varadi et al. | 371/29.1 |
| 4,607,219 | 8/1986 | Isosaka | 437/8 |
| 4,817,052 | 3/1989 | Shinoda | 365/104 |
| 4,858,196 | 8/1989 | Hein | 365/226 |
| 4,975,883 | 12/1990 | Baker et al. | 365/226 |
| 5,173,875 | 12/1992 | Komatsu et al. | 365/226 |
| 5,214,604 | 5/1993 | Kato | 365/185 |
| 5,219,765 | 6/1993 | Yoshida et al. | 437/8 |
| 5,224,070 | 6/1993 | Fandrich et al. | 365/485 |
| 5,287,313 | 2/1994 | Okajima | 365/201 |
| 5,291,454 | 3/1994 | Yamasaki et al. | 365/226 |
| 5,298,433 | 3/1994 | Furuyama | 365/201 |
| 5,337,279 | 8/1994 | Gregory et al. | 365/201 |
| 5,357,458 | 10/1994 | Yu et al. | 365/226 |
| 5,363,335 | 11/1994 | Jungroth et al. | 365/226 |
| 5,402,380 | 3/1995 | Kumakura et al. | 365/210 |
| 5,424,994 | 6/1995 | Nagasawa | 365/226 |
| 5,430,402 | 7/1995 | Tedrow et al. | 365/226 |

FOREIGN PATENT DOCUMENTS

| | | |
|---|---|---|
| 0306990 | 9/1988 | European Pat. Off. . |
| 59-48933 | of 1984 | Japan . |

Primary Examiner—Tan T. Nguyen
Attorney, Agent, or Firm—Nikaido Marmelstein Murray & Oram LLP

[57] ABSTRACT

An object of the present invention is to provided a semiconductor device that permits easy and efficient testing. A semiconductor device which is characterized in that the power supply for an output circuit is selectable between a normal power supply and an independent power supply provided independently of the normal supply.

3 Claims, 24 Drawing Sheets

TOP PLAN

A-A' CROSS SECTION

B-B' CROSS SECTION

Fig.9
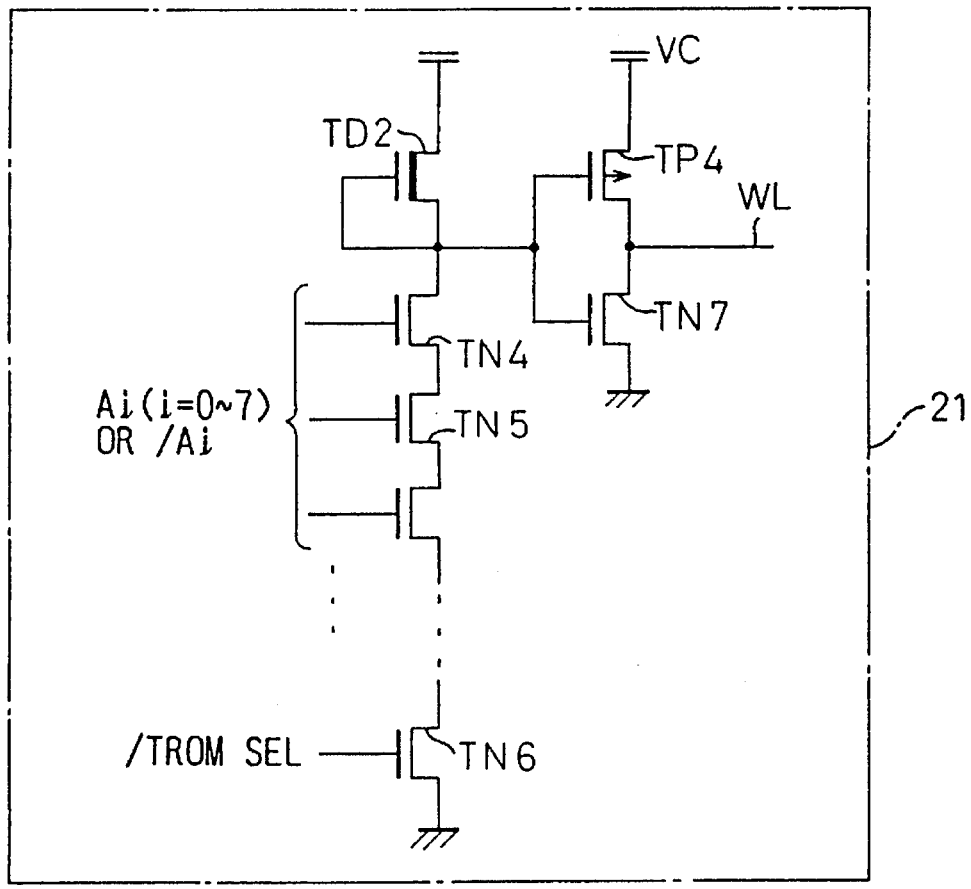
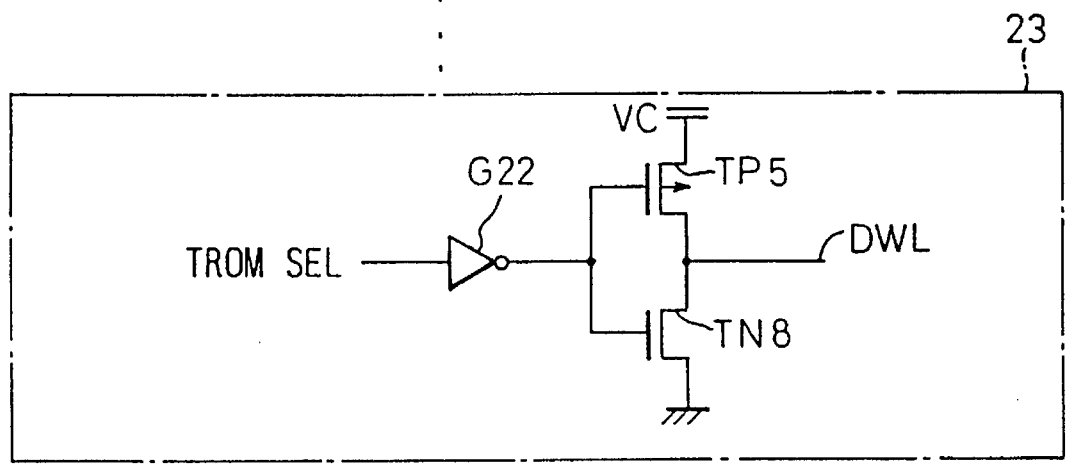

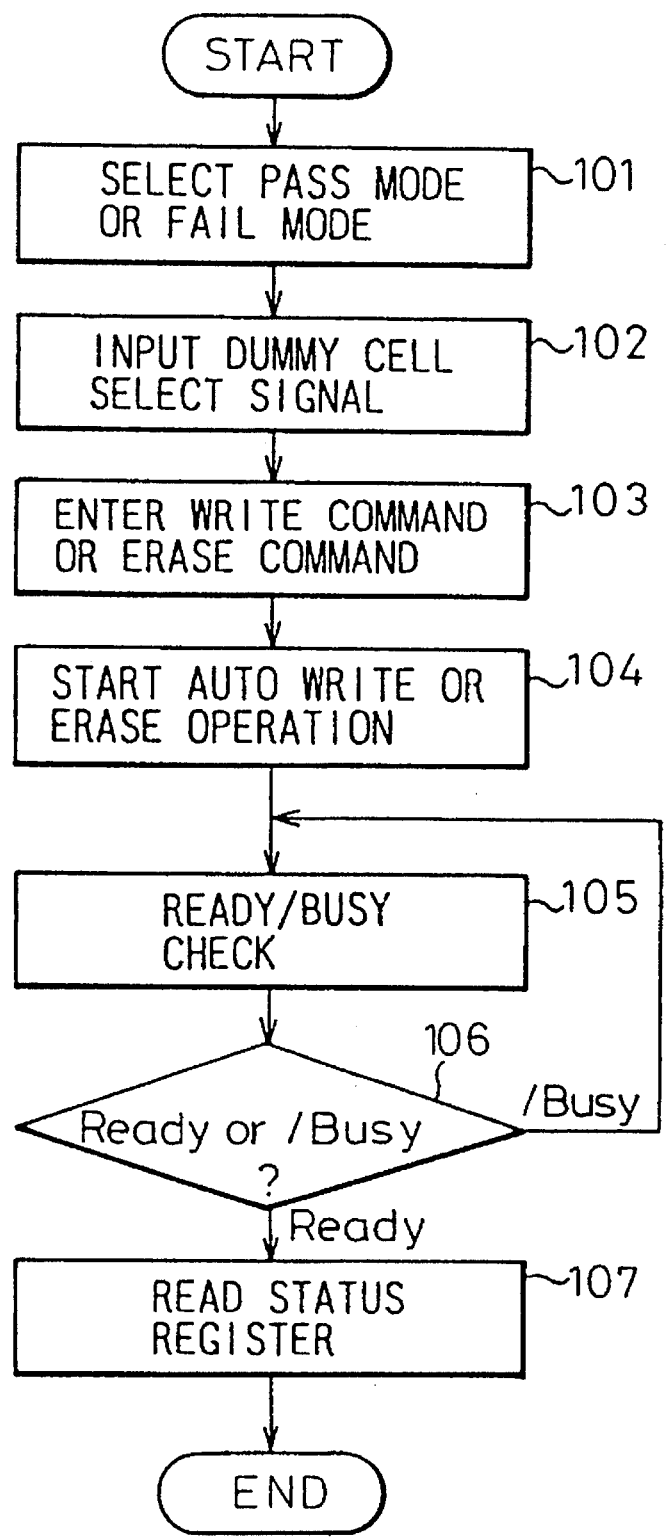

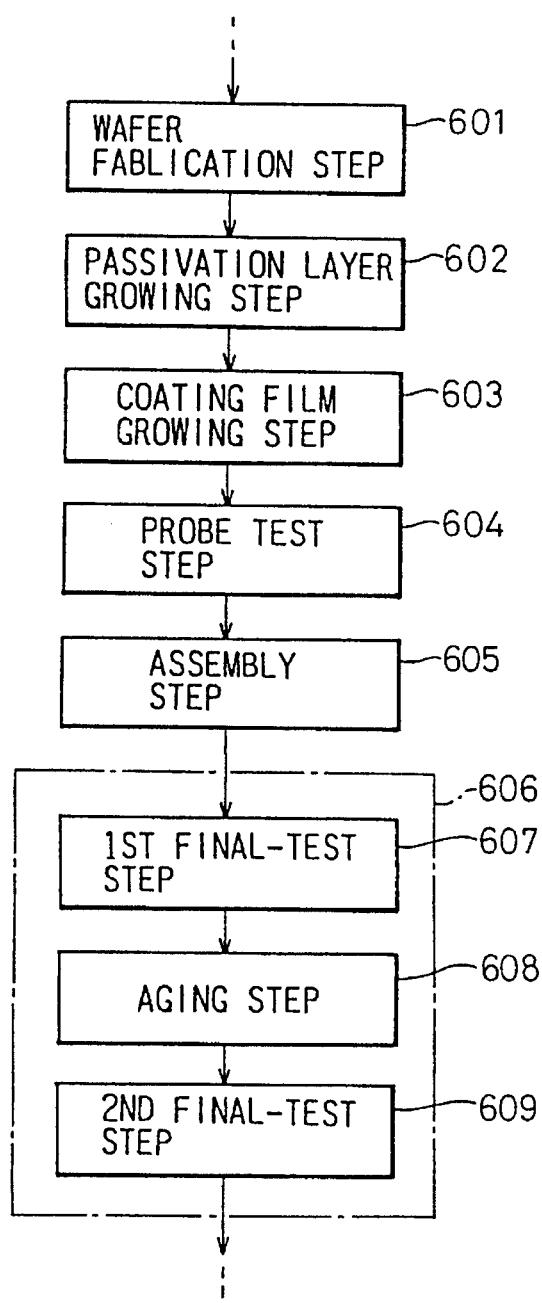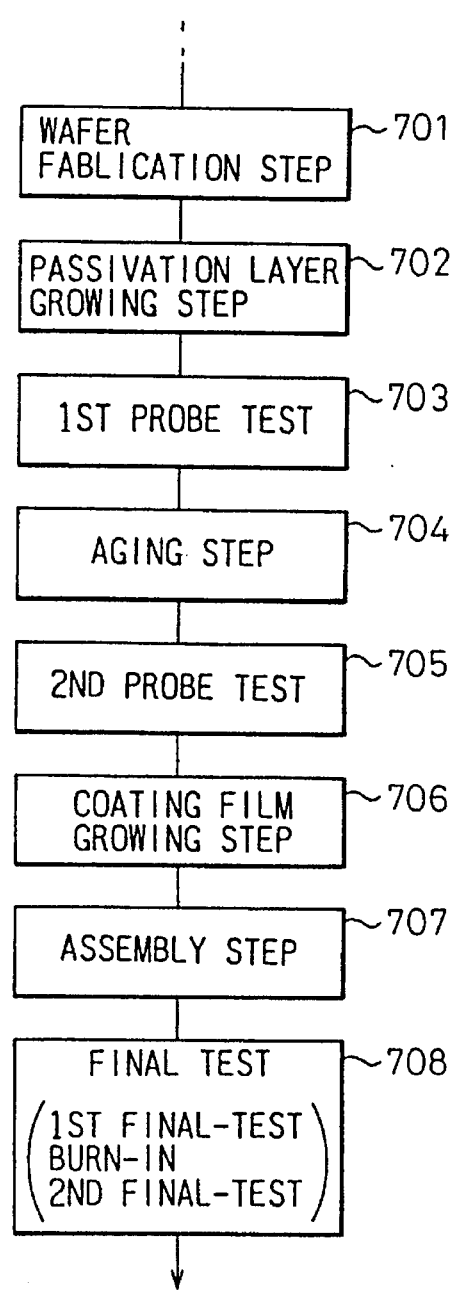

5,566,386

NONVOLATILE SEMICONDUCTOR MEMORY DEVICE HAVING A STATUS REGISTER AND TEST METHOD FOR THE SAME

This is a divisional, of application Ser. No. 08/365,847 filed Dec. 29, 1994, now U.S. Pat. No. 5,469,394, which is a divisional application of Ser. No. 08/192,821 filed on Feb. 7, 1994, now U.S. Pat. No. 5,402,380.

BACKGROUND OF THE INVENTION (1) Field of the Invention

The present invention relates to a nonvolatile semiconductor memory, and a test method for the same. Further, the invention relates to a semiconductor memory having a sense amplifier, and a semiconductor device. More particularly, the invention relates to a semiconductor device and a test method for the same, wherein testing can be conducted easily to check whether the fabricated semiconductor device has a prescribed performance.

(2) Description of the Related Art

Semiconductor memories such as DRAM and SRAM are widely used, and flash memory has been attracting attention as an electrically erasable nonvolatile memory. Each memory cell of a flash memory consists of a single transistor. This transistor is called a memory cell transistor. A memory cell transistor of the flash memory has the structure of an n-channel MOS transistor with a floating gate formed beneath its gate. For erasure, a control gate is left open, and a high voltage is applied to a source, which causes a charge to be drawn through the source, leaving almost zero charge on the floating gate. In this situation, when an appropriate voltage is applied to the control gate, the transistor conducts. When a high voltage is applied to the control gate and the drain, avalanche breakdown occurs, and part of electrons that have gained high energy near the drain are captured by the floating gate.

This operation is called writing. Once writing is done, the charge remains accumulated on the floating gate, so that the transistor will not conduct even when a voltage is applied to the control gate. Data is defined according to whether the transistor conducts or not. In the flash memory, the writing and erasure of information can be accomplished electrically, as described above.

Flash memories require different voltages for different operating modes, read, write, and erasure, for application to various elements, and accordingly, their control operations are complex: Furthermore, a read or erase operation is usually followed by a verify operation to verify the processed data by reading it. Such operations have previously been done by applying prescribed voltages to designated terminals of the flash memory by using a writer or other external equipment. This puts a great deal of load on the writer and other external equipment used for write and erase operations.

To simplify such complex control algorithms, the recent flash memory design incorporates automatic circuitry that allows the writing and erasure of flash memory cells to be accomplished just by entering simple control commands from the outside. Such a flash memory design is becoming predominant.

In a flash memory equipped with such automatic circuitry, once an external control command is accepted, all processing is automatically done internally until a cell write or erase operation is completed. It is therefore usual to provide a status register facility as a means for allowing external monitoring of the device status.

Once the automatic circuitry is activated, it is not possible to know the status of internal circuitry without reading out the status register.

After the fabrication of a semiconductor device is completed, various tests are performed to check whether the semiconductor device has the prescribed performance.

In the case of a nonvolatile memory such as a flash memory, for example, a test is performed to check whether the status register functions properly. The status register provides an external indication of the status of write and erase operations performed by the operational logic circuit; that is, the bit values in the status register indicate whether the write or erase operation has been completed correctly. Therefore, to verify whether the status register is functioning correctly, the operational logic circuit is actually made to perform various operations to produce various status conditions, and the status register is tested to see whether it reflects the status correctly.

In the status register test procedure above, only the operation of the status register is tested. For example, when the operation of the status register for write mode is tested, the test result of normal or failure is set into the status register without performing real write and verify operations. Therefore, the procedure does not guarantee that the status register 2 will function properly when a failure occurs in the memory cell matrix or a sense amplifier/write amplifier.

Namely, with the status register test for a flash memory explained above, it is only possible to verify the status register function and part of the whole circuit operation.

In the testing of memories, with increasing memory capacity, the test time is increasing by a large extent, which pushes the test costs even higher than before. To reduce the test costs, it is important to be able to identify defects in the shortest possible time, but at the same time, it is also important to combine various tests into a single comprehensive test process to reduce the test time and minimize the increase in test costs. Therefore, in the status register test also, it is desirable that the test be performed in a more comprehensive manner, not limiting the test to the parts mentioned above. The test method currently practiced is not sufficient from this point of view.

Among tests unique to a nonvolatile memory such as a flash memory, there is a test to guarantee proper retention of the stored data for long periods of time after power to the memory is removed. Since such a long-period test cannot be performed under actual conditions, the data retention test is usually conducted by an accelerated test called an aging test. In the aging test, after writing is done up to a prescribed level, accelerating stresses are applied to stress the data retention conditions by holding the device at a temperature higher than normal, and after that, the threshold level is detected.

As described above, each individual device is subjected to the aging test after it is assembled and sealed in a package.

However, since the aging test as described above is performed in the final test step after the device assembly, a sufficiently high temperature cannot be applied to the device assembled in a plastic package, thus requiring a long aging time to guarantee the reliability of data retention, and hence increasing the number of steps.

There has been proposed another process different from the above process in which the aging test is performed between a passivation layer growing step and the coating film growing step. In this process, after writing is done up to a prescribed level, accelerating stresses are applied in the aging step where the device is held for one hour at 300° C. Then, the data level is verified.

With the aging test described above, while it can guarantee the device reliability since the devices are subjected to aging on the wafer, it still involves a problem in that it increases the number of steps.

Furthermore, for a semiconductor memory, a power supply margin on the high-voltage side that can be applied to the memory cell needs to be measured. However, the memory cell current characteristic is such that the gradient decreases with increasing gate voltage; therefore, the sense amplifier of the prior art has the problem that the sense point becomes displaced when the supply voltage is increased, which prevents correct cell comparison. To avoid this problem, an extra circuit has to be added so that the sense amplifier power supply can be separated from the cell power supply, and also, a special test for measuring it has to be added.

When measuring the power supply margin for the sense amplifier, the test is performed using a circuit that separates the sense amplifier power supply from the cell gate power supply. Such a test, however, cannot be performed in the usual test process, but a separate test step for that purpose needs to be provided. The problem here is that the extra test in addition to the usual test steps will introduce an extra cost which will be reflected in the final chip cost.

Furthermore, for a semiconductor device, the power supply current during operation needs to be measured. Because of the test process employed, the power supply current is measured using a setup with the output pin connected to a load circuit. The measuring conditions for the operating power supply current guaranteed in specifications, etc., require that the current flowing through a load be 0 mA. However, when the measurement is made with the output connected to the load circuit, the correct current value cannot be obtained since the charge/discharge current flowing through the load circuit is also measured. Therefore, when measuring the guaranteed design value, the output pin is disconnected from the measuring circuit.

With the output circuit setup described above, the power supply current cannot be accurately measured; therefore, the measurement is made after disconnecting the output pin from the measuring circuit. This introduces a cumbersome step in the test process.

SUMMARY OF THE INVENTION

The present invention has been made in view of the above enumerated problems, and has the following objects.

A first object is to provide a nonvolatile semiconductor memory that permits comprehensive testing of the status register function, sense amplifiers, etc., including internal automatic circuitry, and that serves to achieve improvements in test efficiency and test accuracy.

A second object is to provide a test method for a nonvolatile semiconductor memory, which can sufficiently guarantee the data retention reliability of the nonvolatile semiconductor memory, while minimizing the cost increase due to an increased number of steps.

A third object is to provide a sense amplifier which is capable of producing an accurate output even when the power supply is switched to a high-voltage side.

A fourth object is to provide an output circuit that permits accurate measurement of the power supply current without having to detach the load circuit from the output pin.

According to a first mode of the present invention, which accomplishes the first object, there is provided a nonvolatile semiconductor memory which comprises: a plurality of word lines and a plurality of bit lines arranged in a grid pattern; a memory cell matrix consisting of electrically erasable nonvolatile memory cells whose gates are connected to the word lines and whose drains are connected to the bit lines, each of the memory cells being formed at one of the intersections between the word lines and the bit lines; a sense amplifier for outputting a signal corresponding to a logic value "1" or "0" by detecting the amount of current that varies according to whether the memory cell located at the intersection between a selected word line and a selected bit line is conducting or nonconducting; a write/erase timing circuit for automatically performing timing control necessary for writing data into and erasing data from the memory cells; and a status register for storing the operating state of the memory at the completion of the operation of the write/erase timing circuit in such a manner that the stored state is accessible externally, the nonvolatile semiconductor memory being characterized by the provision of dummy cells provided outside the address of the memory cell matrix and consisting of electrically unalterable cells each preset to one of two states so that the sense amplifier outputs a logic value "1" or "0" depending on the state of the accessed dummy cell.

In a semiconductor memory according to the first mode of the present invention, testing the status register function does not involve forcibly applying a test signal to part of the internal automatic circuitry, as was practiced in the prior art, but is accomplished by performing an operation to write data "0" into a dummy cell that is preset to data "0" and is not alterable, thus making it appear as if the write operation has been completed successfully. Conversely, if an operation is performed to write data "0" to a dummy cell that is fixed to data "1" and is not alterable, it is possible to make it appear as if a write failure has occurred.

Likewise, in an erasure test, if an erase operation is performed on a dummy cell that is fixed to data "1" and is not alterable, it is possible to make it appear as if the erasure has been done successfully. Conversely, if an erase operation is performed on a dummy cell that is fixed to data "0" and is not alterable, it is possible to make it appear as if an erase failure has occurred.

Thus, according to the first mode of the invention, it is possible to check the performance of the entire circuit, including the internal automatic circuitry, for both cell normal and cell failure states. While in the prior art it was only possible to check the status register function and parts of other circuitry, the present invention makes it possible to check the performance of the entire circuit including the internal automatic circuitry, in addition to the status register function check.

According to a second mode of the present invention, which accomplishes the second object, there is provided a test method for a writable nonvolatile semiconductor memory, which comprises: a writing step for writing data; an aging step where the nonvolatile semiconductor memory is placed under prescribed aging conditions; and a verification step where data is read out and compared with the data written in the writing step for verification, the test method being characterized in that the aging step incorporates a step of forming a coating film for alleviating the stress applied to the nonvolatile semiconductor memory during assembly.

In the test method for a nonvolatile semiconductor memory according to the second mode of the present invention, since the aging step is performed on the semiconductor memory fabricated on a wafer, the memory can be subjected to a high temperature. Furthermore, in the step of forming a coating film that serves as a stress relieving film during assembly, the memory is held at a high temperature for a prescribed period of time which also provides aging conditions. This achieves a reduction in the number of test steps.

According to a third mode of the present invention, which accomplishes the third object, there is provided a semiconductor memory having a sense amplifier, wherein the sense amplifier contains a load resistance section comprising a plurality of load transistors having different load characteristics which are selectable for connection.

In the semiconductor memory according to the third mode of the present invention, the sense amplifier includes a plurality of load transistors having different load characteristics, and the load transistors are selectable for connection according to the supply voltage. This ensures accurate cell comparison over the supply voltage ranging from the normal operating voltage to a high voltage.

According to a fourth mode of the present invention, which accomplishes the fourth object, there is provided a semiconductor device which is characterized in that the power supply for an output circuit is selectable between a normal power supply and an independent power supply provided independently of the normal supply.

In the semiconductor device according to the fourth mode of the invention, the output circuit can be switched between the normal power supply and the independent power supply. Therefore, when measuring the power supply current, the power supply for the output transistors is switched from one power supply to the other. This prevents extra current from flowing to the power supply (VCC) for other circuits, so that the power supply current during operation can be measured accurately, without affecting the device operation.

BRIEF DESCRIPTION OF THE DRAWINGS

The present invention will be more clearly understood from the description as set forth below with reference to the accompanying drawings, wherein:

FIG. 9 is a circuit diagram showing a row decoder according to the first embodiment according to the first embodiment;

FIG. 17 is a flowchart showing a test procedure for a status register according to the first embodiment;

FIGS. 18A and 18B are flowcharts showing processes incorporating an aging test according to the prior art.

DESCRIPTION OF THE PREFERRED EMBODIMENTS

Before proceeding to a detailed description of the preferred embodiments of the present invention, prior art non-volatile semiconductor memories will be described, with reference to the accompanying drawings relating thereto, for a clearer understanding of the differences between the prior art and the present invention.

Figure 1A:
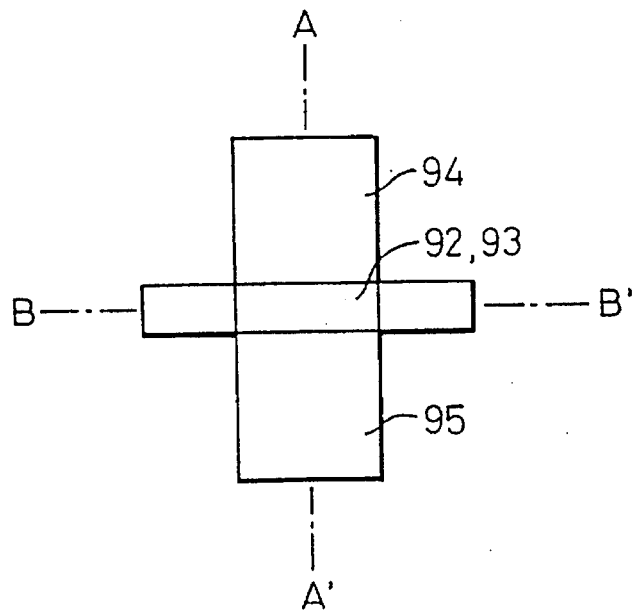
FIGS. 1A through 1C are diagrams showing a memory cell structure of a flash memory.
Figure 1B:
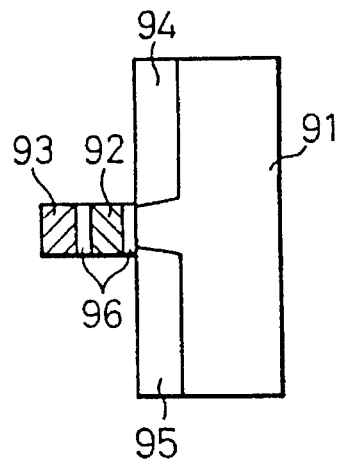
Figure 1C:
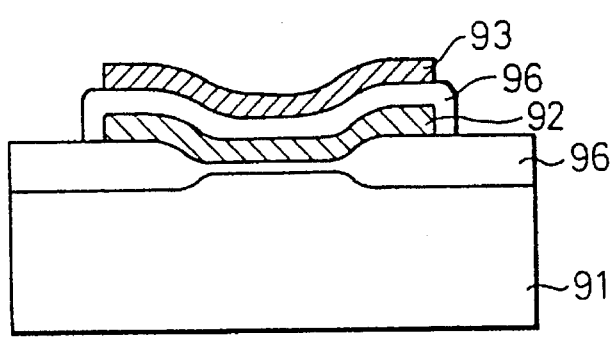

An example of the memory cell transistor of the flash memory is shown in FIGS. 1A through 1C: FIG. 1A shows a top plan view, FIG. 1B shows an A–A' cross section, and FIG. 1C shows a B–B' cross section. Reference numeral 91 indicates a p-type silicon (Si) substrate, 92 indicates a floating gate (FG) foraged from polysilicon, 93 indicates a control gate (CG) formed from polysilicon capacitively coupled to the FG 92, 92 and 95 indicate n-type regions which form the source and drain, and 96 indicates an oxide film.

Figure 2:
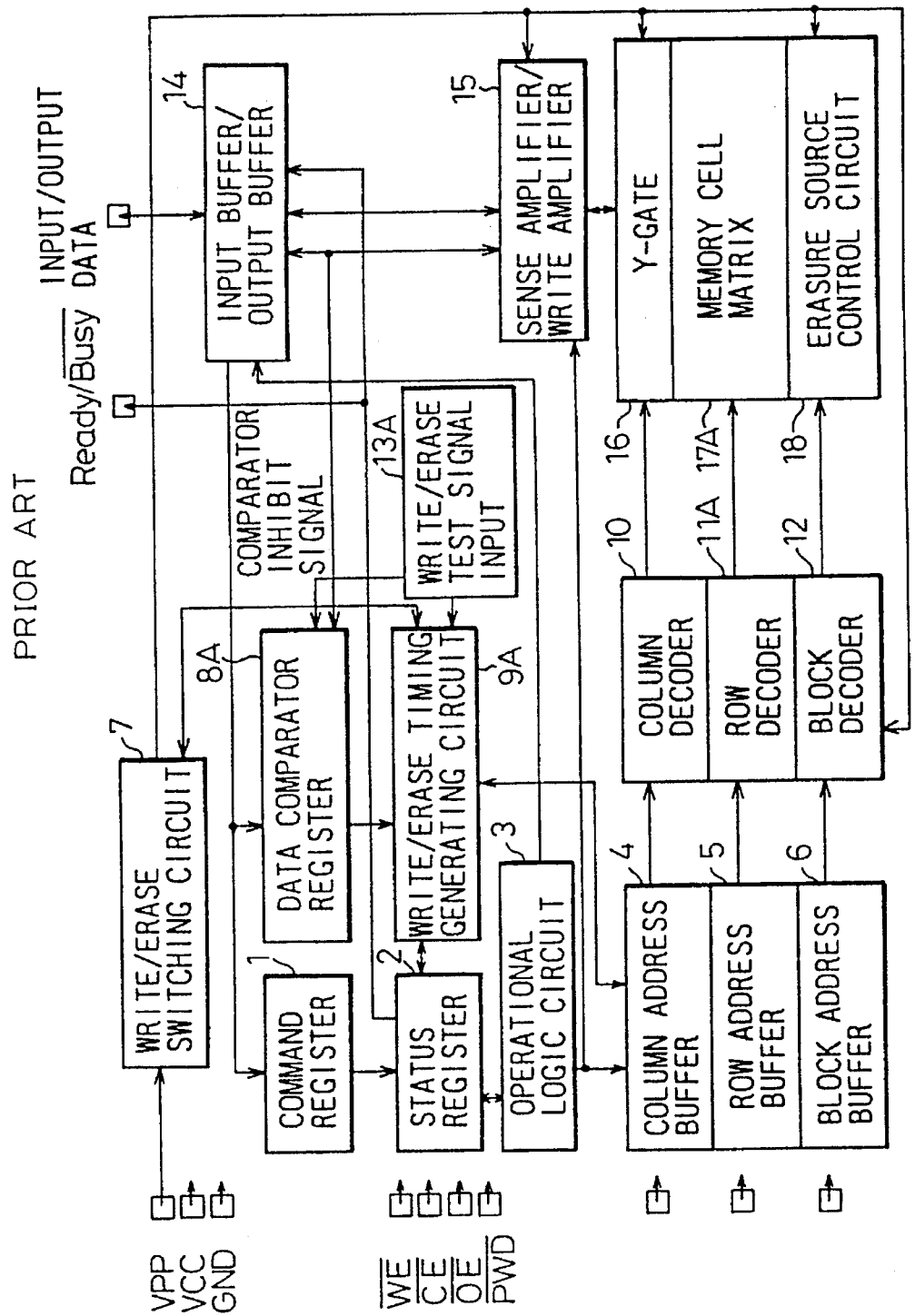
FIG. 2 is a block diagram showing the configuration of a prior art flash memory.

FIG. 2 is a block diagram showing the configuration of a prior art flash memory. Throughout the drawings, the same reference numerals are used to indicate the same functional elements, while the reference numerals with an alphabetic character suffixed thereto indicate elements having similar, but not the same, functions. The numeral 1 indicates a command register circuit, 2 indicates a status register circuit, 3 indicates an operational logic circuit, 4 indicates a column address buffer, 5 indicates a row address buffer, 6 indicates a block address buffer, 7 indicates a write/erase switching circuit, 8A indicates a data comparator circuit, 9A indicates a write/erase timing generating circuit, 10 indicates a column decoder, 11A indicates a row decoder, 12 indicates a block decoder, and 13A indicates a write/erase test signal input circuit which, only when a test signal is input to it, forcibly activates the write/erase timing generating circuit 9A while inhibiting the data comparator function of the data comparator circuit 8A. The numeral 14 indicates an input/output buffer, 15 indicates a sense amplifier/write amplifier, 16 indicates a Y-gate, 17A indicates a memory cell matrix, and 18 indicates an erasure source control circuit.

As described above, flash memories put a great deal of load on the writer and other external equipment used for write and erase operations. To simplify such complex control algorithms, the recent flash memory design incorporates automatic circuitry that allows the writing and erasure of flash memory cells to be accomplished just by entering simple control commands from the outside. A flash memory equipped with such automatic circuitry usually provides a status register facility as a means for allowing external monitoring of the device status. Once the automatic circuitry is activated, it is not possible to know the status of internal circuitry without reading out the status register.

After the fabrication of a semiconductor device is completed, a test is performed to check whether the status register functions properly. The status register provides an external indication of the status of write and erase operations performed by the operational logic circuit; that is, the bit values in the status register indicate whether the write or erase operation has been completed correctly. Therefore, to verify whether the status register is functioning correctly, the operational logic circuit is actually made to perform various operations to produce various status conditions, and the status register is tested to see whether it reflects the status correctly.

Figure 3:
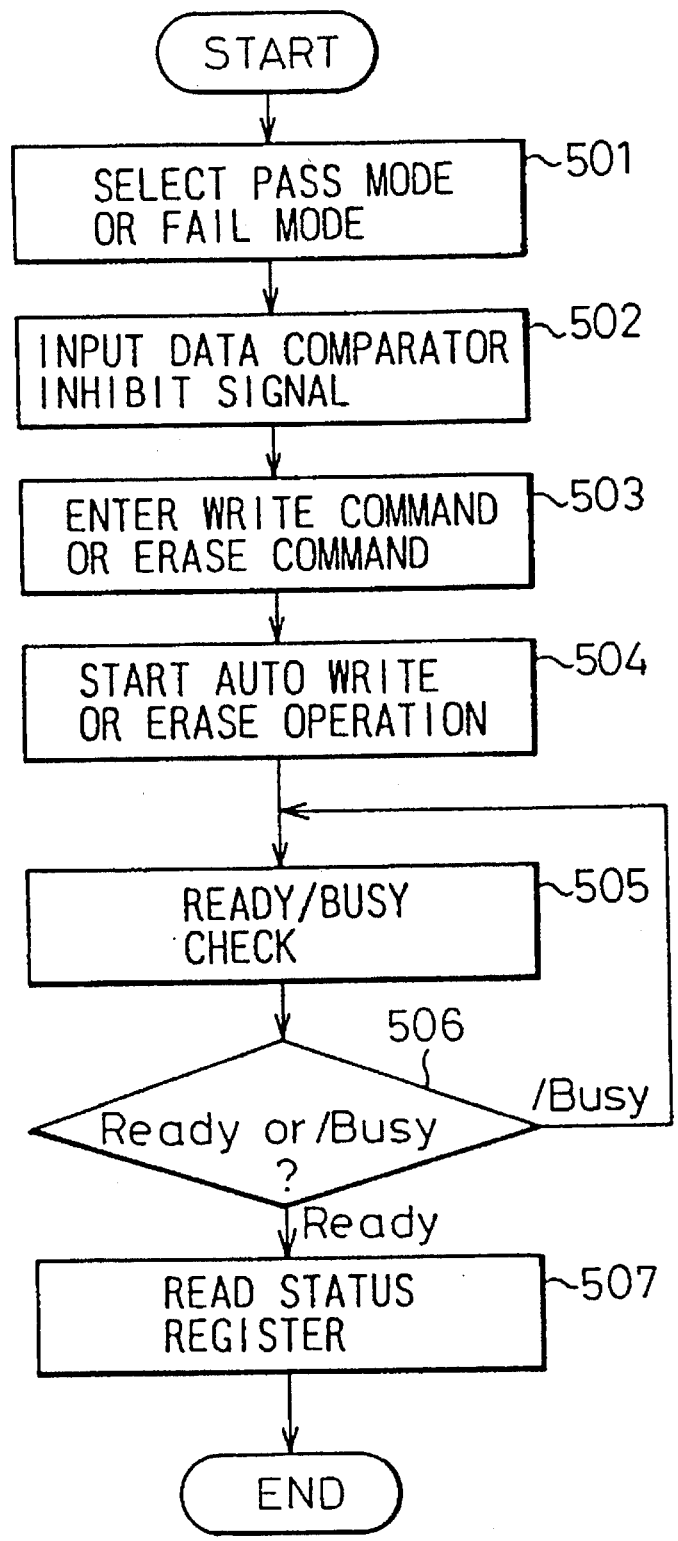
FIG. 3 is a flowchart showing a test procedure for a status register according to the prior art.

FIG. 3 is a flowchart showing a prior art status register test procedure for a flash memory.

First, in step 501, selection is made as to whether the test is performed with a normal operation mode or in such a manner as to induce a failure, and the write/erase test signal input circuit 13A of FIG. 2 is set accordingly. In response to the selection, data comparison by the data comparator register circuit 8A is inhibited in step 502 so that the result of the normal or fail mode operation can be obtained independently of the data to be compared. In step 503, a command is entered for a write or erase operation whichever is selected, and in step 504, the selected operation is started.

The operation cycles through steps 505 and 506 until it is completed. When the operation is completed, the status register value is read out to verify that the value reflects the correct status.

The status register test procedure of the prior art is performed in the above manner. In the above procedure, however, it is the data comparator register 8 that causes an operation failure, and the procedure does not guarantee that the status register 2 will function properly when a failure occurs in the memory cell matrix 17A or the sense amplifier/write amplifier 15.

A first embodiment of the present invention corresponds to the first mode of the invention which serves to achieve improvements in test efficiency and test accuracy of the status register.

Figure 4:
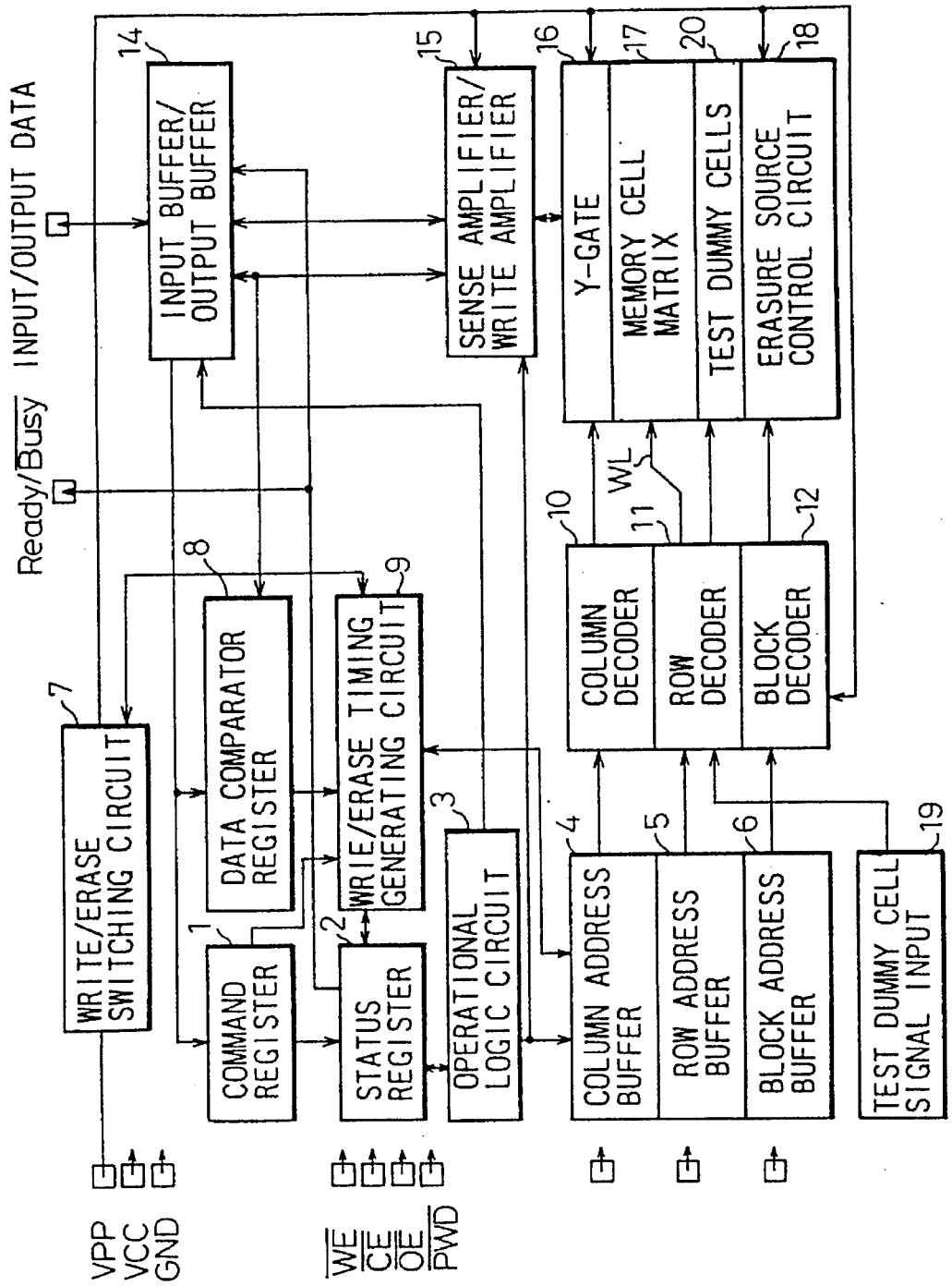
FIG. 4 is a block diagram showing the configuration of a first embodiment of the present invention.

FIG. 4 is a block diagram showing the configuration of a flash memory according to a first embodiment of the invention. The configuration shown corresponds to that of the prior art shown in FIG. 2; the same functional elements are indicated by the same reference numerals between the two figures, while corresponding elements having different functions are indicated by the same reference numerals but with an alphabetic suffix "A" in FIG. 2. The numeral 1 indicates a command register circuit, 2 indicates a status register circuit, 3 indicates an operational logic circuit, 4 indicates a column address buffer, 5 indicates a row address buffer, 6 indicates a block address buffer, 7 indicates a write/erase switching circuit, 8 indicates a data comparator circuit, 9 indicates a write/erase timing generating circuit, 10 indicates a column decoder, 11 indicates a row decoder, 12 indicates a block decoder, 14 indicates an input/output buffer, 15 indicates a sense amplifier/write amplifier, 16 indicates a Y-gate, 17 indicates a memory cell matrix, and 18 indicates an erasure source control circuit. The numeral 19 indicates a test dummy cell select signal input circuit, and 20 indicates a test dummy cell block consisting of a dummy cell that is fixed to "0" and is not alterable, and a dummy cell that is fixed to "1" and is not alterable. In this embodiment, although only one dummy cell of each type is provided in the test dummy cell block, a plurality of dummy cells of each type may be provided.

By comparing FIG. 2 and FIG. 4, it is apparent that elements comprising the flash memory of the first embodiment are almost the same as those of the prior art flash memory. Therefore, only portions relating to the status register test will be described. Further, the status register test is divided into a test for write mode and a test for erase mode. To simplify the explanation, circuits relating only to the test for write mode will be explained.

Figure 5:
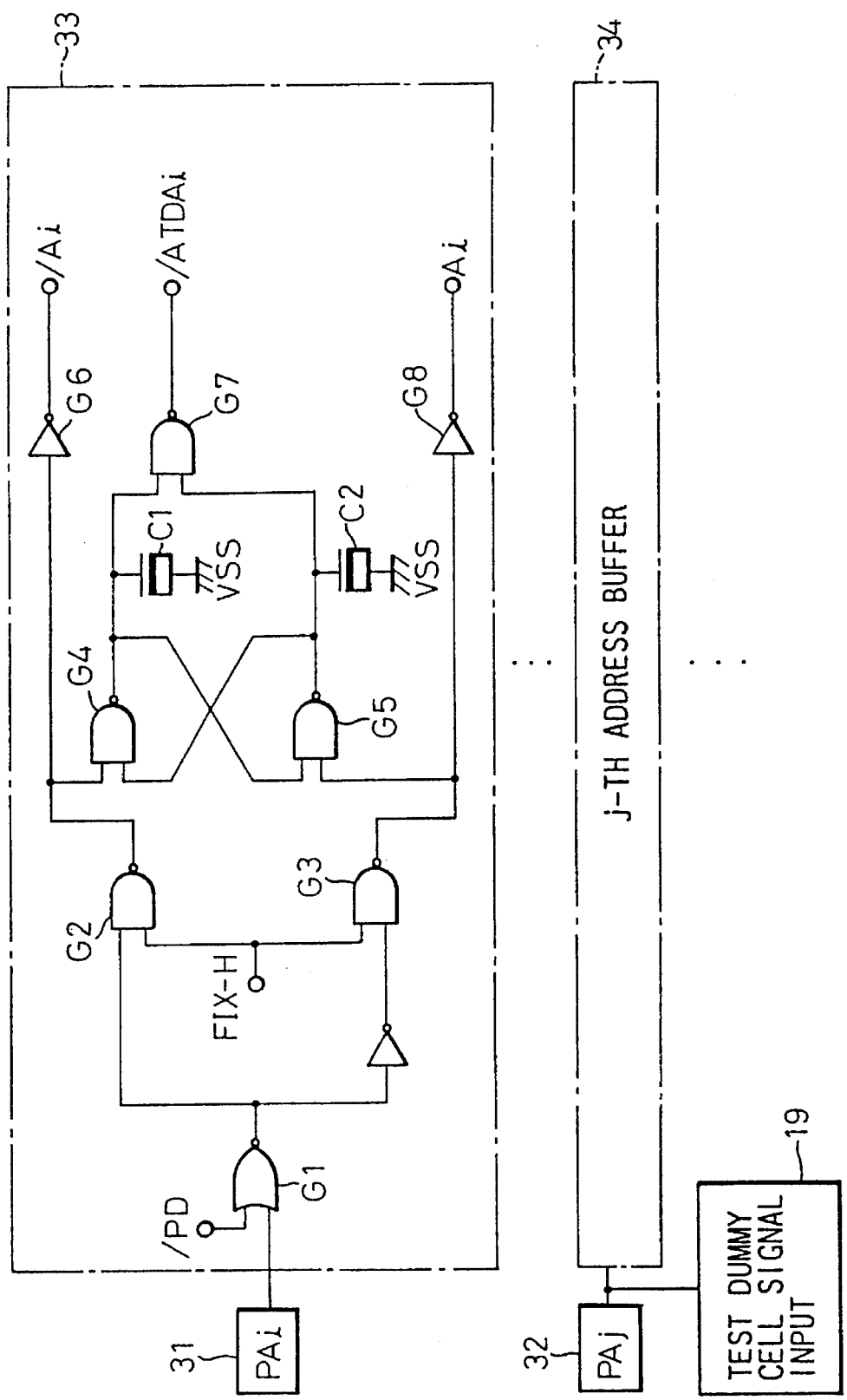
FIG. 5 is a circuit diagram showing an address buffer according to the first embodiment.

FIG. 5 is a circuit diagram showing address buffers such as the column address buffer 4, the row address buffer 5, and the block address buffer 6.

The address buffer consists of individual address buffers, one indicated at 33, the number of address buffers being equal to the number of bits of an address signal. Each bit of the address signal is input to an address signal input terminal such as PAi or PAj, indicated by references 31, 32. The address signal input terminal 32 is a selected one to which a test dummy cell signal input circuit 19 is connected.

As shown in FIG. 5, each address buffer includes a NOR gate, five NAND gates, three inverters, and two capacitors. A/PD signal is a chip enable signal, and a FIX-H signal is fixed to "High" during operation. The address buffer 33 outputs an Ai signal which is equivalent to the input address signal, a /Ai which is an inverted signal of Ai, and a /ATDAi which is an inverted address transition detection signal.

Figure 6:
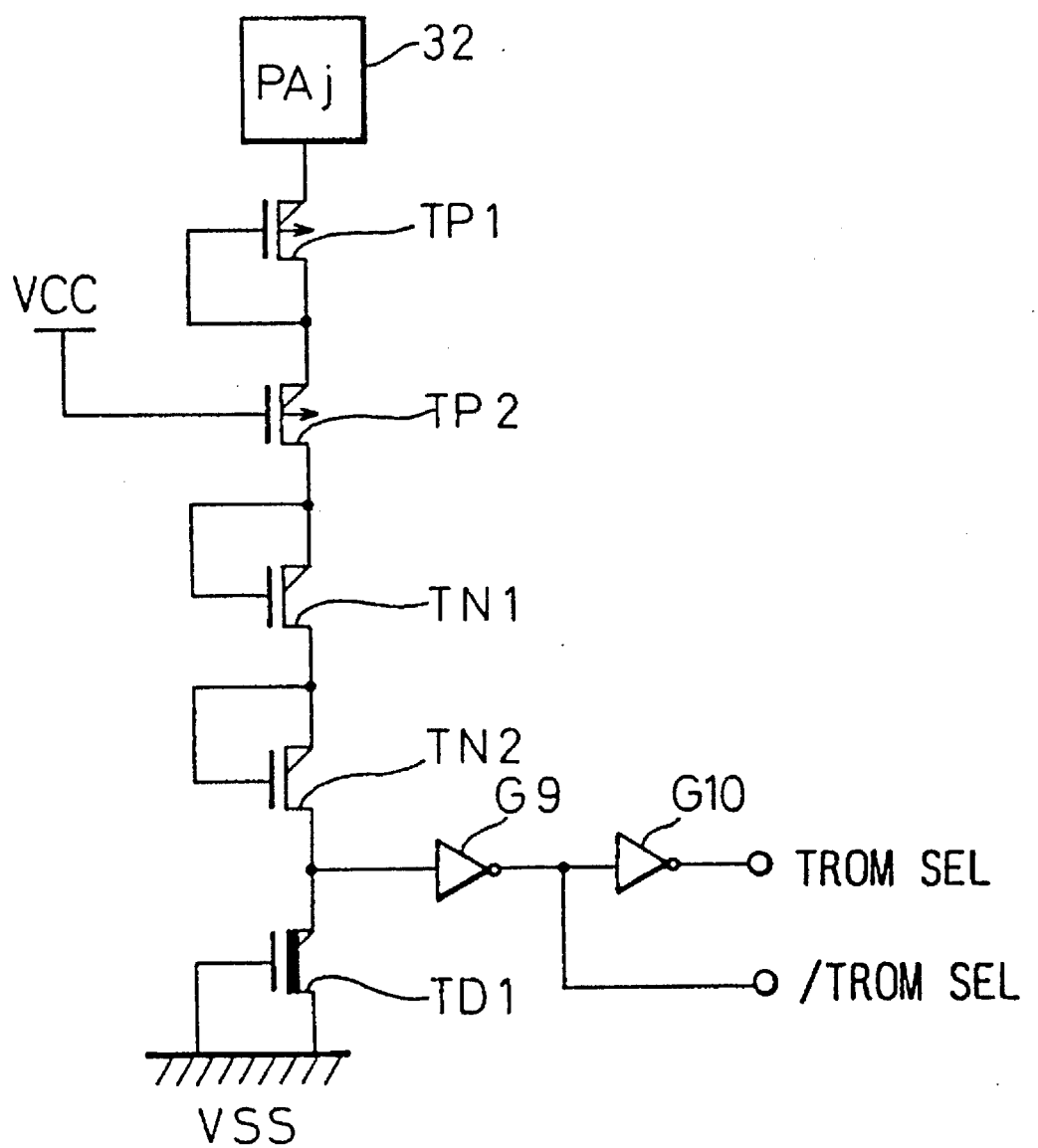
FIG. 6 is a circuit diagram showing a test dummy cell signal input circuit according to the first embodiment.

FIG. 6 shows the test dummy cell select signal input circuit 19 which is connected to the address signal input terminal. The test dummy cell select signal input circuit 19 includes two p-channel transistors TP1 and TP2, two n-channel transistors TN1 and TN2, a depletion type n-channel transistor TD1, and two inverters G9 and G10. In this circuit, transistors of high withstand voltage type are used.

When the test dummy cell is selected for the status register testing, a voltage higher than source voltage VCC by 3 to 4 V is applied to this terminal 32. By this voltage, p-channel transistors TP1 and TP2 are turned on and TN1 and TN2 are also turned on, so that a TROM SEL which is a dummy cell select signal is set to the "High" state. /TROM SEL is an inverted signal of TROM SEL.

Figure 7:
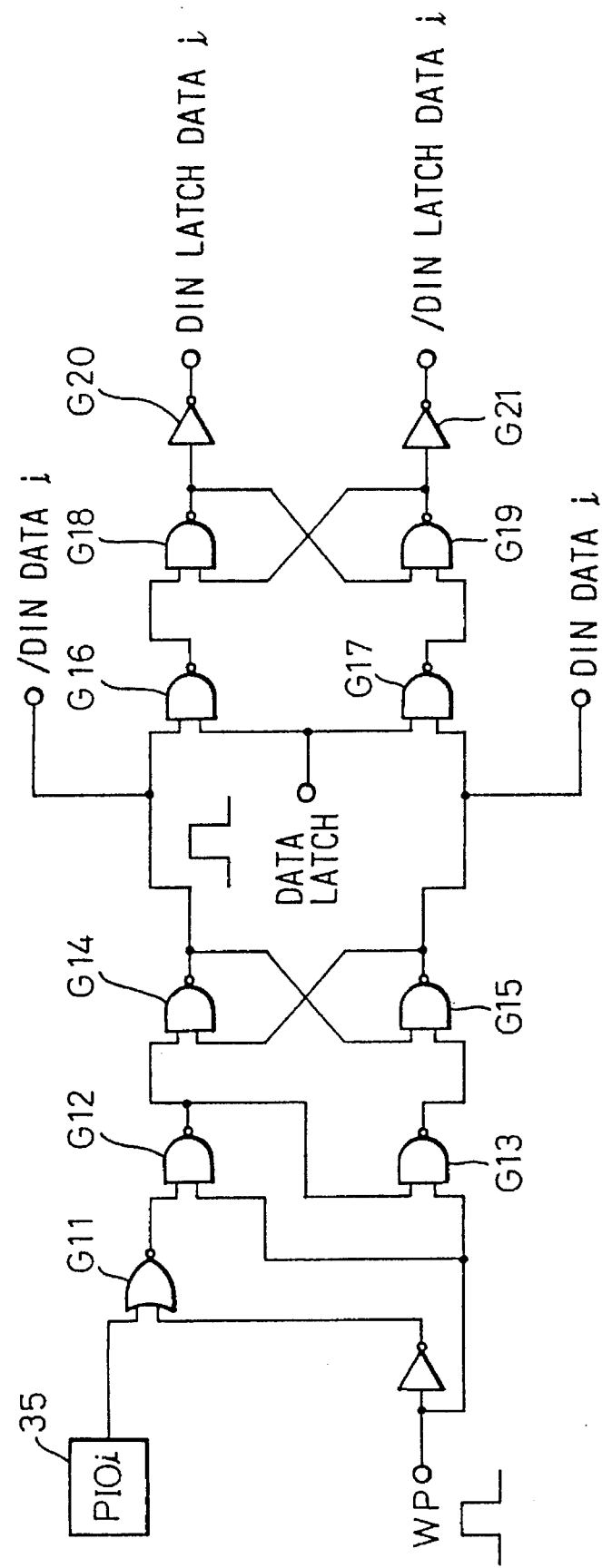
FIG. 7 is a circuit diagram showing a data input buffer according to the first embodiment.

FIG. 7 is a circuit diagram showing the data input buffer. The data input buffer consists of individual data input buffers shown in FIG. 7, the number of data input buffers being equal to the number of bits of a data signal. Each bit of the data signal is input to a data signal input/output terminal such as PIOi indicated by references 35. As shown in FIG. 7, the buffer circuit includes a NOR gate, eight NAND gates, and three inverters. WP is a pulse signal which is normally "Low", and changes to "High" for a short period when data is input. In the following, a pulse signal such as WP is called "a positive pulse", and a pulse which is normally "High" and changes to "Low" in a short period is called "a negative pulse". This data input buffer outputs a Din Data i signal equivalent to the input data signal, and a/Din Data i signal which is an inverted signal of Din Data i. A portion consisting of NAND gates G16 through G19 and inverters G20, G21 operates as a latch circuit. The state of this latch circuit is set when a DATA LATCH signal is "High", and the latched data is held while DATA LATCH is "Low". The latch circuit outputs Din Latch Data i and /Din Latch Data i.

Figure 8:
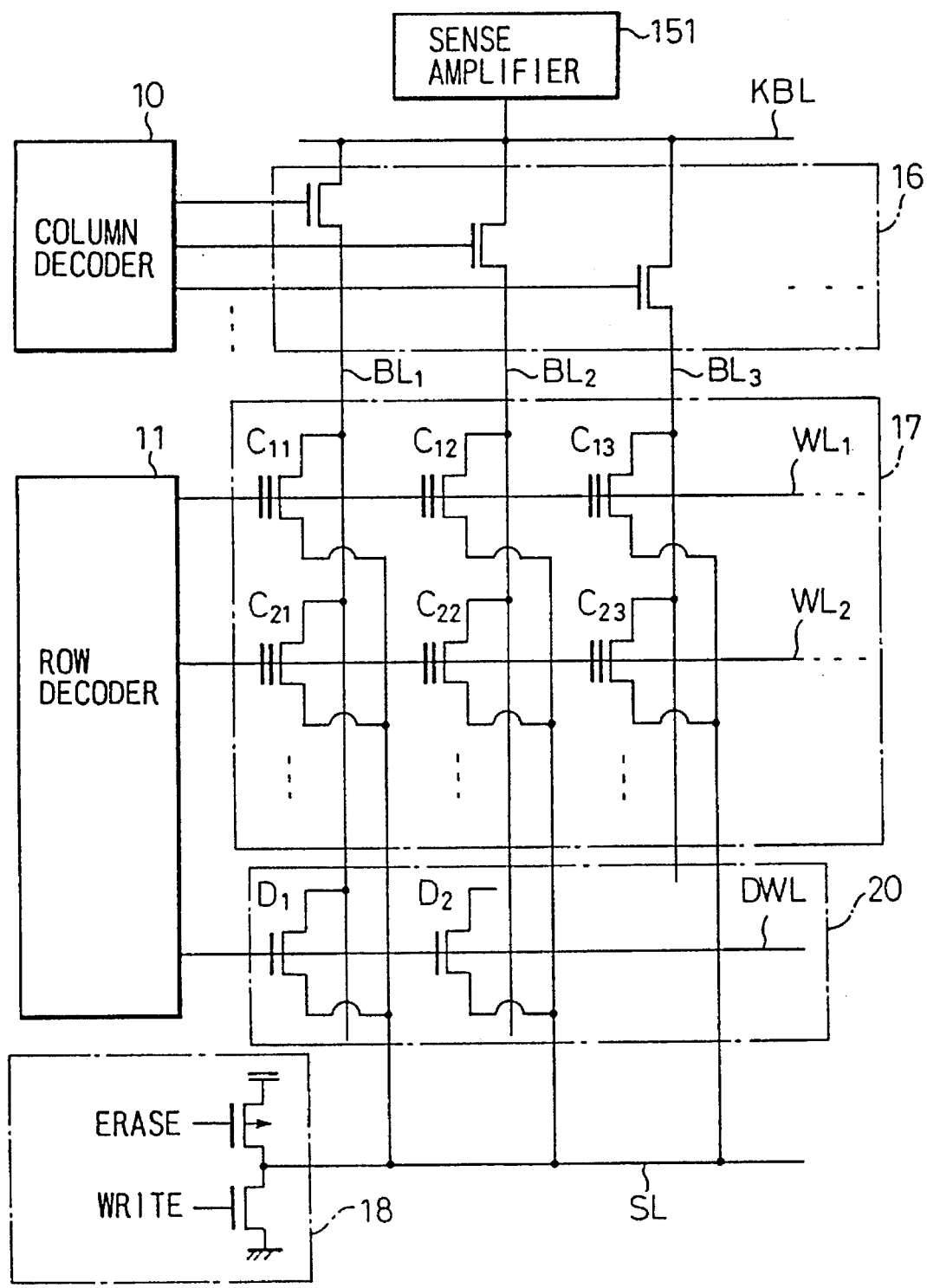
FIG. 8 is a circuit diagram showing a memory cell matrix according to the first embodiment.

FIG. 8 is a diagram showing the Y-gate 16, memory cell matrix 17, erasure source control circuit 18, and test dummy cell block in more detail.

As shown in FIG. 8, unlike other memory cells, the dummy cells, $D_1$ and $D_2$ are conventional n-channel transistors that do not have a floating gate; their gates are connected to a dummy word line DWL, and their sources are connected to a common source line SL; the drain of the dummy cell D1 is connected to a first bit line $BL_1$, and the drain of the dummy cell D2 is not connected to a second line $BL_2$. The dummy cells $D_1$ and $D_2$ are accessed by selecting the dummy word line DWL and the first bit line $BL_1$ or the second bit line $BL_2$. As in the case of the normal memory cells Cij, current flows or does not flow to the common bit line KBL according to whether or not the dummy cell conducts, and the state is sensed by the sense amplifier 151. The dummy cells are thus read out in the same manner as the normal memory cells Cij.

As shown in above, the dummy cell $D_1$ is a conventional n-channel transistor which is turned ON when it is accessed. Therefore, when the dummy cell $D_1$ is accessed, a current flows from the first bit line $BL_1$ to ground through the dummy cell $D_1$, and the data "1" is always read out. Since drain of the dummy cell $D_2$ is not connected to the bit line $BL_2$, when the dummy cell $D_2$ is accessed, a current does not flow from the first bit line $BL_1$ to ground through the dummy cell $D_2$, and the data "0" is always read out.

In the erasure source control circuit 18, a WRITE signal is "High" during read and write operation, and an ERASE signal is "Low" during erasure operation. Therefore, in accordance with the input signal the n-channel transistor TN13 is turned on for read and write operations, to connect the common source line SL to ground, and the p-channel transistor is turned on for an erase operation, to apply a high voltage to the common source line SL.

FIG. 9 is a diagram showing the row decoder 11 in more detail.

The row decoder 11 consists of individual decoders, one indicated at 21, the number of decoders being equal to the number of word lines, and a voltage VC is applied to the word line selected by decoding the address signal. As VC, VCC is applied for a read operation, and VPP is applied for a write operation. TN6 indicates one of the AND gates forming the decoder; since /TROM SEL is "Low" when selecting a dummy cell, "Low" signal is applied to this gate to inhibit the selection of the normal memory cells Cij. The numeral 23 indicates a circuit for driving the dummy word line DWL; since TROM SEL is "High" when selecting a dummy cell, "High" signal is input so that the voltage VC is applied to the dummy word line DWL. As a result, the dummy cell is selected, and the normal memory cells are deselected.

Figure 10:
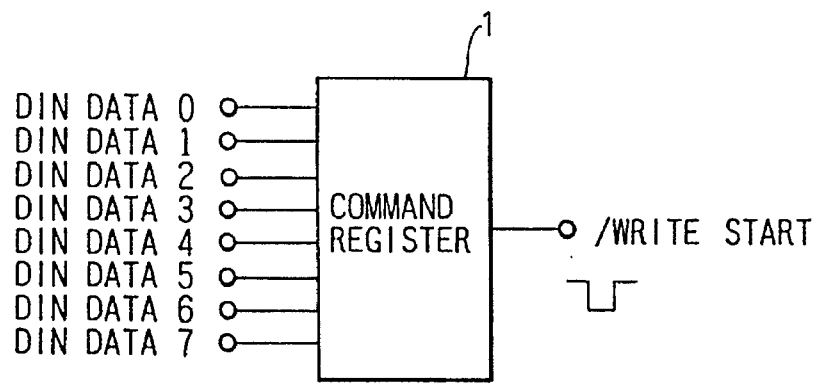
FIG. 10 is a diagram showing a command register according to the first embodiment.

FIG. 10 shows the command register 1. A write command is input as a predetermined hexadecimal data such as #40 or #10. This data is supplied to the command register through the input data buffer, and the command register 1 outputs a /WRITE START signal which is a negative pulse signal generated when the write operation starts.

Figure 11:
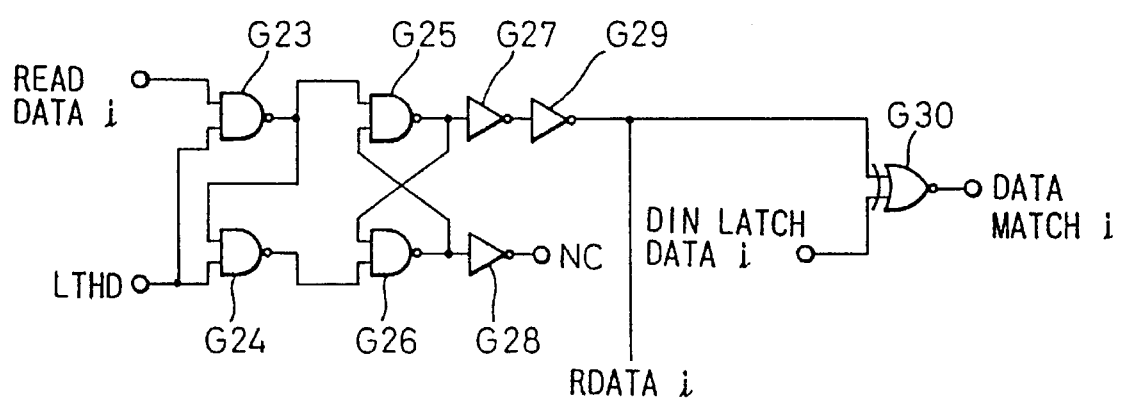
FIG. 11 is a circuit diagram partly showing a data comparator register and a data output buffer according to the first embodiment.

FIG. 11 shows a part of the data comparator register 8 and a part of the data output buffer.

In this circuit, an Exclusive NOR gate G30 corresponds to the data comparator. The data comparator register 8 consists of individual data comparators, one indicated in FIG. 11. Namely, each data bit is respectively judged at the circuit shown in FIG. 11. The portion except the Exclusive NOR gate G30 forms a latch circuit which latches a READ DATA i signal output from the sense amplifier 151. LTHD is a positive pulse signal generated when the memory cells including the dummy cells are read. This latch circuit outputs a READ DATA i signal. READ DATA i is compared with Din Latch Data i which is held in the data input buffer. When these data coincide, DATA MATCH i becomes "High".

Figure 12:
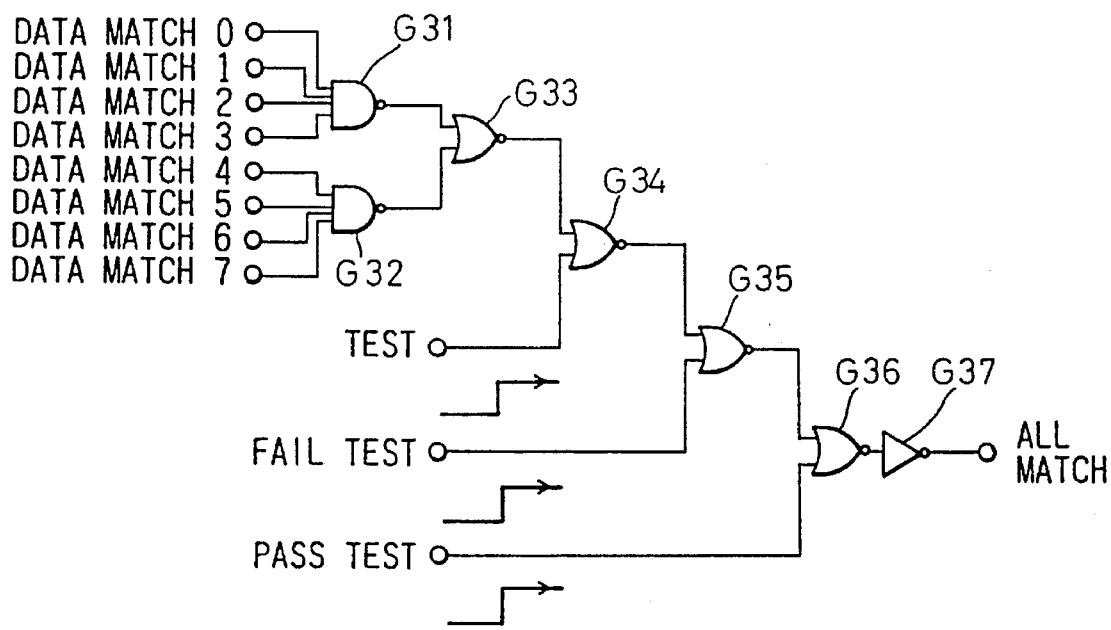
FIG. 12 is a circuit diagram showing the remaining part of the data comparator.

FIG. 12 shows the remaining portion of the data comparator register 8.

All DATA MATCH i signals output from the circuits shown in FIG. 11 are further judged at two NAND gates G31 and G32, and a NOR gate G33 to determine whether or not all of them are "High". Namely, when read data of each bit respectively coincides to latched data which is same as the input data, an output of the NOR gate G33 becomes "High". During normal operation, since TEST, FAIL TEST, and PASS TEST signals are "Low", therefore, an ALL MATCH signal is "High" when read data of each bit respectively coincides to input data. Namely, the ALL MATCH signal represents a test result.

As shown in FIG. 12, when the TEST is set to "High", it is possible to set the ALL MATCH to be "High" by inputting "High" signal as the PASS TEST signal, and it is possible to set the ALL MATCH to be "Low" by inputting a "High" signal as the FAIL TEST signal irrespective of the output the NOR gate G33. In a conventional status register test method, the ALL MATCH signal is set "High" or "Low" by setting the PASS TEST and FAIL TEST signals, and a path from this portion to the data output buffer through the status register is checked. Therefore, the prior art test method does not guarantee that the status register 2 will function properly when a failure occurs in the memory cell matrix 17A or the sense amplifier/write amplifier 15. However, in the first embodiment, this is guaranteed. Further, in the first embodiment, the conventional status register test method in which the PASS TEST signal and the FAIL TEST signal are used is also available.

Figure 13:
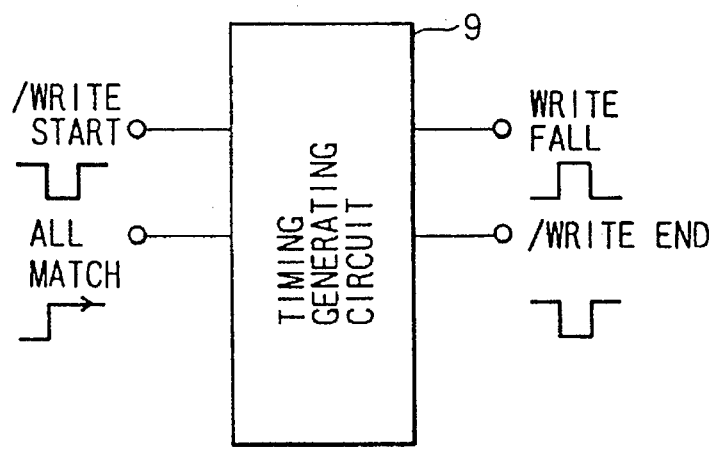
FIG. 13 is a diagram showing a timing generating circuit according to the first embodiment.

FIG. 13 is a diagram showing the write/erase timing generating circuit 9. This circuit 9 receives a /WRITE START signal from the command register 1 and an ALL MATCH signal from the data comparator register 8. When the ALL MATCH changes to "High" or when write operations are repeated for a predetermined number of times, the circuit 9 outputs a /WRITE END signal which is a negative pulse signal. Further, the circuit 9 outputs a WRITE FAIL signal which is a positive pulse signal.

Figure 14:
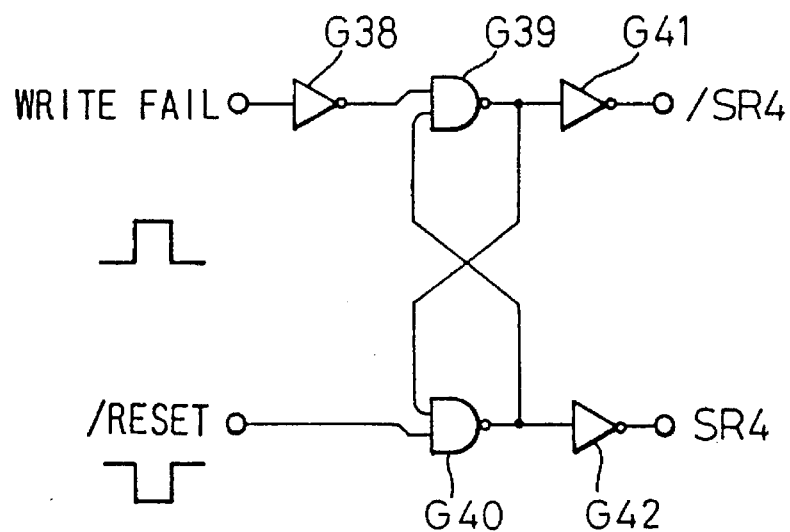
FIGS. 14 and 15 are circuit diagrams respectively showing individual registers included in a status register.
Figure 15:
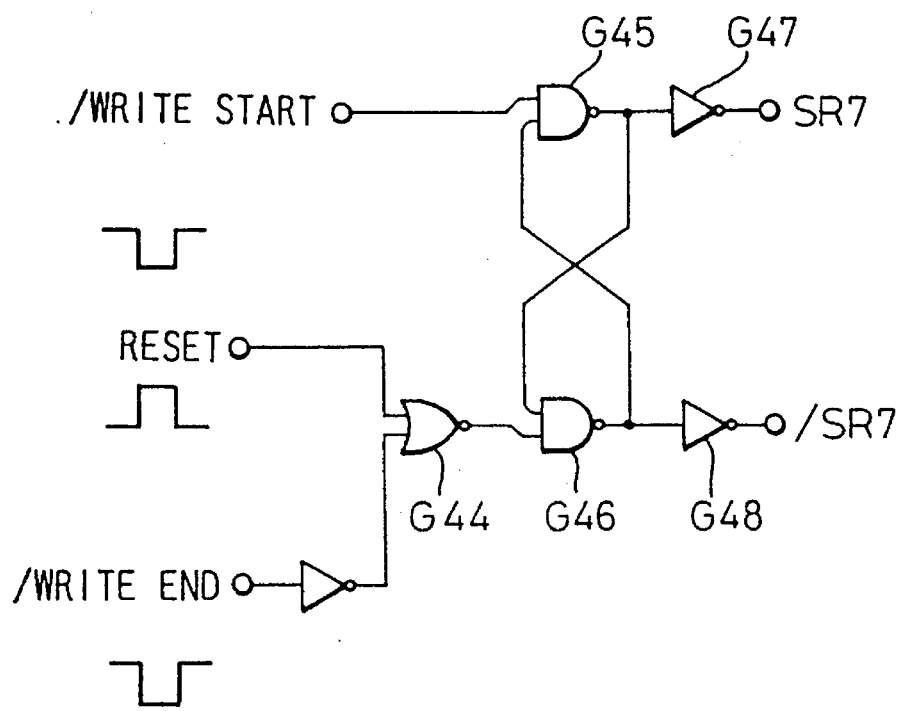

The status register 2 consists of individual registers. FIGS. 14 and 15 respectively show each one of the individual registers in the status register 2.

The status register shown in FIG. 14 receives the WRITE FAIL, and outputs a SR4 signal. The SR4 signal is set to "High" by inputting a /RESET signal which is a negative signal, and its state is held unless a WRITE FAIL signal is input. Namely, the SR4 is "Low" when a write operation is performed without failing, and the SR4 is "High" when a write operation fails.

The status register shown in FIG. 15 outputs a busy signal as SR7 which is normally "High", and is "Low" during a write operation.

Figure 16:
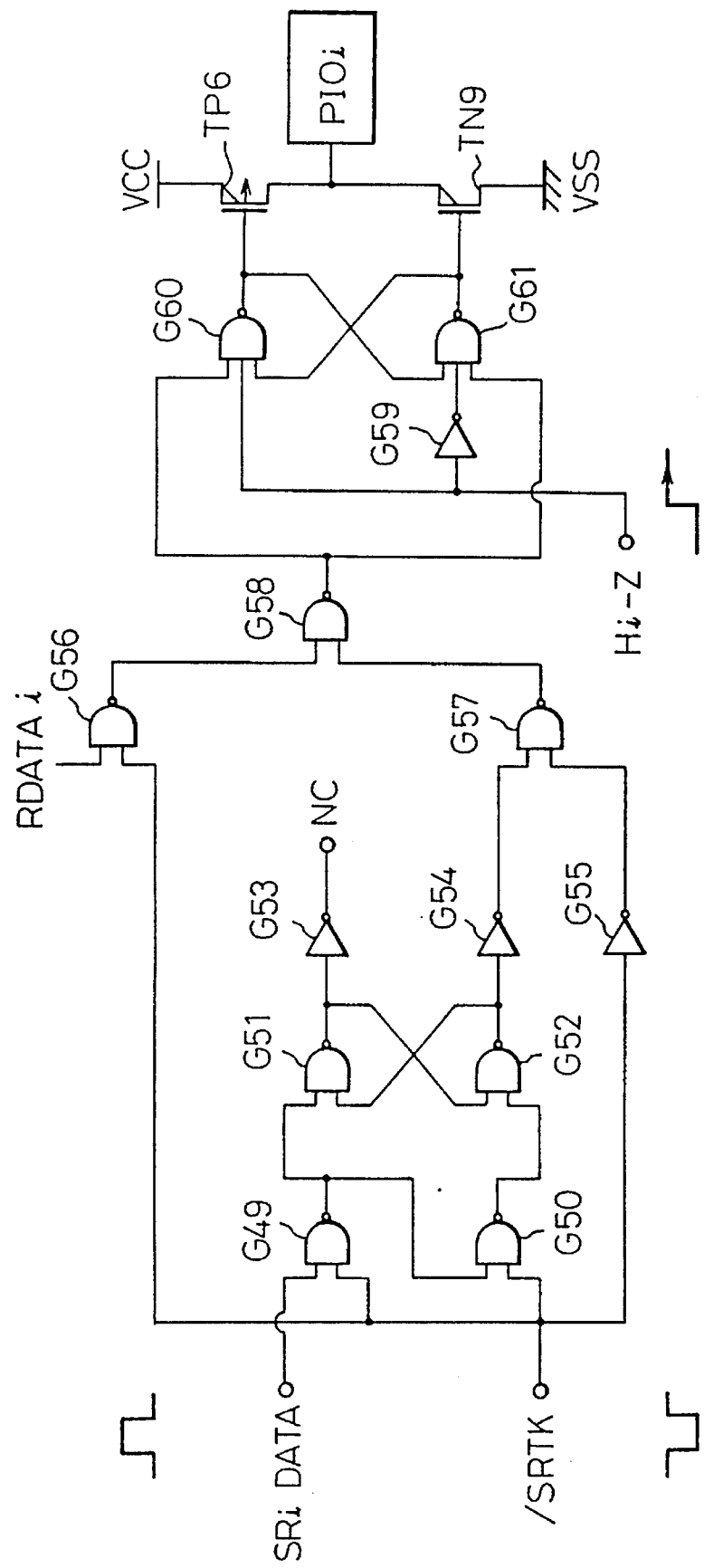
FIG. 16 is a circuit diagram showing a part of the data output buffer according to the first embodiment.

FIG. 16 is a circuit diagram showing the data output buffer. The data output buffer consists of individual data output shown in FIG. 7, the number of data output buffers being equal to the number of bits of data signal. Each bit of data signal is output to a data signal input/output terminal such as a PIOi. This circuit is divided into two portions. One portion includes NAND gates G49 through G52, G56 through G58, and inverters G53 through G55. This portion receives a RDATA i signal output from the circuit shown in FIG. 11 and a SRi DATA signal output from the status register, and is controlled to output the RDATA i or the SRi DATA by inputting a /SRTK signal which is a negative pulse signal. When read data is read out, the /SRTK is set to a "High" state, and RDATA i passes through a NAND gate G56 to be output from a NAND gate G58. When status register data is read out, the /SRTK is set to a "Low" state, and SRi DATA passes through a NAND gate G57 to be output from the NAND gate G58.

A portion consisting of an inverter G59, two input NAND gates G60, G61, a p-channel transistor TP6, and an n-channel transistor TN9, is an output circuit. When a Hi-Z signal is "High", either of the p-channel transistor TP6 or the n-channel transistor TN9 turns ON in accordance with output of the NAND gate G58. Namely, data is output to the PIOi. When the Hi-Z is "Low", both of p-channel transistor TP6 and the n-channel transistor TN9 turn OFF, and the output of the PIOi is at a high impedance state.

In the above, circuits we've described only regarding the write mode, however, circuits to automatically perform the erase operation are also provided.

The following describes a test procedure for testing the performance of the status register circuit 2 in the first embodiment. FIG. 17 is a flowchart showing the test procedure.

To initiate the performance test, first a pass mode for normal operation or a fail mode that induces an operation failure is selected in step 101. Then, by applying a prescribed voltage to the terminal 31 of the test dummy cell select signal input circuit 19, the dummy cell select signal is applied to the row decoder 11 which then selects the word line connecting to the dummy cells. Next, in step 102, the column address is changed so as to select a dummy cell that is fixed to data "0" and is not alterable, or a dummy cell that is fixed to data "1" and is not alterable. For example, to test the function of the status register circuit for the write circuitry when a cell write is accomplished correctly, a dummy cell that is fixed to data "0" and is not alterable is selected. In this state, a write command is entered in step 103, and a normal write operation is performed in step 104. Then, the write operation should terminate normally. After the operation is completed through steps 105 and 106, the status register is read out in step 107 to determine whether the status register is functioning properly when the write operation is completed normally. On the other hand, to check the function of the status register circuit in case of the occurrence of a failure, a dummy cell that is fixed to data "1" and is not alterable is selected in step 102. In this state, when a normal write operation is performed, the writing should terminate in a failed state. Based on this, determination can be made as to whether the status register circuit is functioning properly in case of the occurrence of a write failure.

Likewise, to test the function of the status register circuit for the erase circuitry, a dummy cell that is fixed to data "1" and is not alterable is selected if it is desired to test the function of the status register circuit when an erasure is done correctly. In this state, when a normal erase operation is performed, the erasure should terminate normally, based on which it can be determined whether the status register circuit is functioning properly when the erase operation is completed normally. On the other hand, to check the function of the status register circuit in case of the occurrence of an erasure failure, a dummy cell that is fixed to data "0" and is not alterable is selected. In this state, when a normal erase operation is performed, the erasure should terminate in a failed state. Based on this, a determination can be made as to whether the status register circuit is functioning properly in case of the occurrence of an erasure failure. Thus, the testing is performed in a comprehensive manner, including the entire write and erase circuitry, to check the performance of the entire circuit including the automatic circuit for both cell normal and failed states.

Alternatively, the test may be so configured that the test signal for selecting the dummy cell is input to the column address side; in this state, the row address is changed so as to select a dummy cell that is fixed to data "0" and is not alterable or a dummy cell that is fixed to data "1" and is not alterable. In this configuration also, the same effect as described above can be achieved.

Thus, in the first embodiment, it is possible to check the performance of the entire circuit, including the internal automatic circuitry, thereby contributing greatly to improving the reliability.

As described above, a nonvolatile memory such as a flash memory requires a test to guarantee proper retention of the stored data for long periods of time after power to the memory is removed. This data retention test is usually conducted by an accelerated test called an aging test. In the aging test, after writing is done up to a prescribed level, accelerating stresses are applied to the data retention conditions by holding the device at a temperature higher than normal, and after that, the threshold level is detected.

FIG. 18A is a flowchart showing the sequencing of an aging test in a prior art semiconductor device fabrication process.

In the process shown in FIG. 18A, after a wafer fabrication step 601, a passivation layer growing step 602, a coating film growing step 603, a probe test step 604, and an assembly step 605, each individual complete semiconductor device undergoes a final test step 606 where the aging test is performed. In the final test step 606, prescribed operations including writing are performed in a first final-test step 607; then, in an aging step 608, the device is held for several tens of hours at 150° C., for example, and in a second final-test step 609, a second final-test including the measurement of the stored data level is performed.

As described above, in FIG. 16A, each individual device is subjected to the aging test after it is assembled and sealed in a package.

However, since the aging test as described in FIG. 16A is performed in the final test step after the device assembly, a sufficiently high temperature cannot be applied to the device assembled in a plastic package, thus requiring a long aging time to guarantee the reliability of data retention, and hence increasing the number of steps.

The process shown in FIG. 16B is different from that shown in FIG. 16A in that the aging test is performed between the cover film growing step 702 and the coating film growing step 706. After writing is done up to a prescribed level in step 703, accelerating stresses are applied in the aging step 704 where the device is held for one hour at 300° C. In the next step 705, the data level is verified.

With the aging test shown in FIG. 16B, while it can guarantee the device reliability since the devices are subjected to aging on the wafer, it still involves a problem in that it increases the number of steps.

When measuring the power supply margin for the sense amplifier, the test is performed using a circuit that separates the sense amplifier power supply from the cell gate power supply. Such a test, however, cannot be performed in the usual test process, but a separate test step for that purpose needs to be provided. The problem here is that the extra test in addition to the usual test steps will introduce an extra cost which will be reflected in the final chip cost. These problems are dissolved in the second embodiment.

Figure 19:
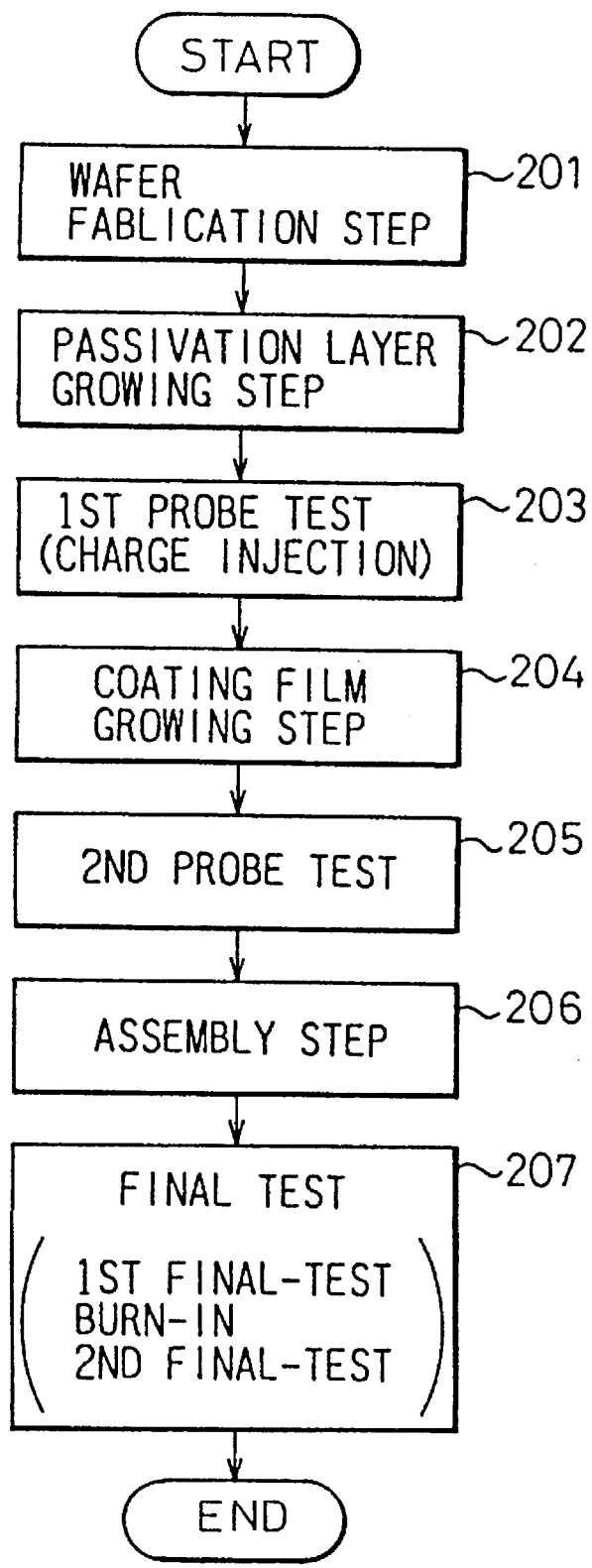
FIG. 19 is a flowchart showing a process incorporating an aging test according to a second embodiment.

FIG. 19 is a flowchart showing a process incorporating an aging test according to a second embodiment of the invention.

In this embodiment, a wafer is fabricated in step 201, a passivation layer is grown in step 202, and a first probe test is performed in step 203, where a charge is injected into the floating gate. Each cell transistor is thus set to the nonconducting state, its output being a "0". In step 204, a coating film is grown; at this time, since the wafer is held at a high temperature for about one hour, the same effect as aging can be achieved, as will be described later. In step 205, a second probe test is performed to check that the output is "0" when reading is done under conditions with a prescribed margin. This completes the data retention test.

Next, in step 206, assembly is done, and in step 207, the final test is performed. In the final test step, a first final test is performed to check prescribed performance items, which is followed by burn-in where the devices are operated continuously for a prescribed period of time. After that, a second final test to test the performance is performed, which completes the final test process.

In the second embodiment, after the coating film growing step in step 204, the second probe test is performed to check the retained charge, but alternatively, this test may be performed in the final test step.

Figure 20:
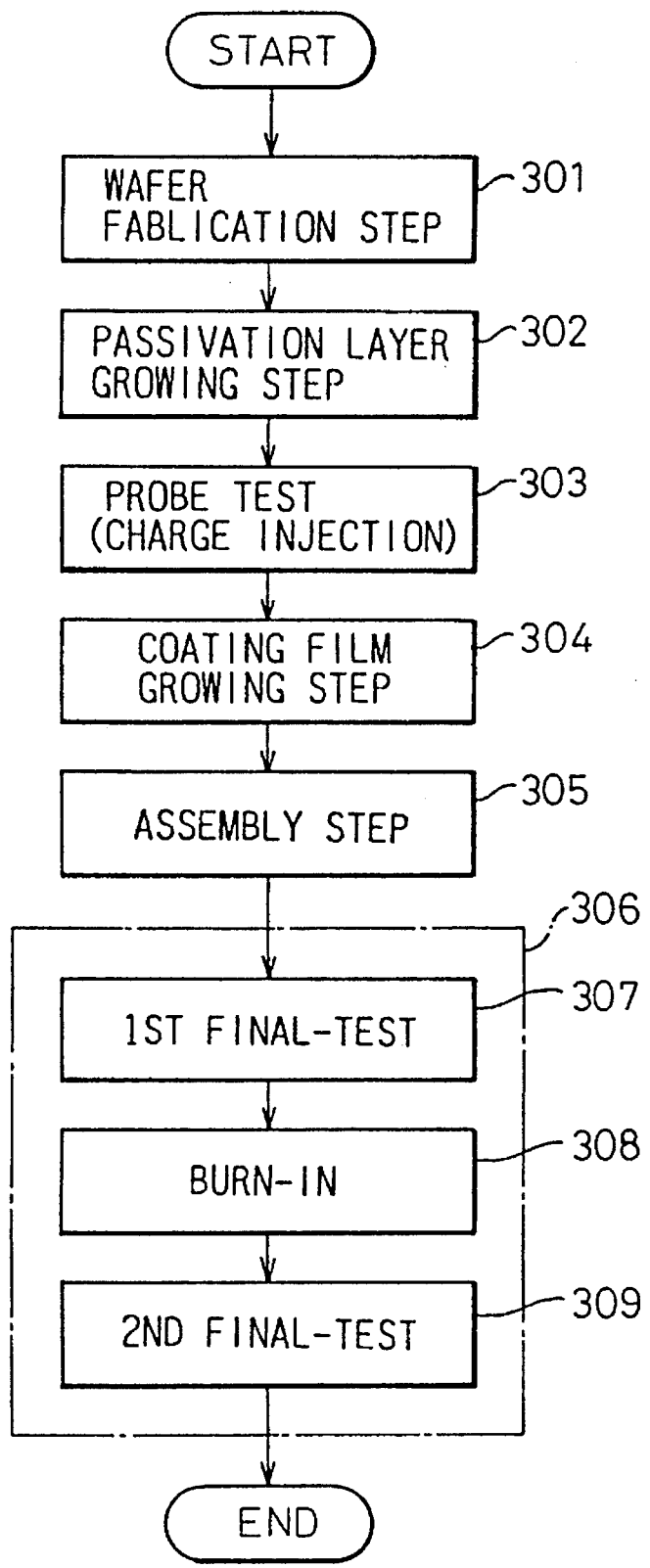
FIG. 20 is a flowchart showing a process incorporating an aging test according to a third embodiment.

FIG. 20 is a flowchart showing the process according to a third embodiment wherein the second probe test described in the second embodiment is incorporated in the final test step. The process shown is different from that shown in the flowchart of FIG. 19 in that the second probe test is omitted and in that the first final test in step 307 includes a test to check whether the charge injected in step 303 is retained after going through the coating film growing step 304 and the assembly step 305. The third embodiment is advantageous in terms of the process since the second probe test can be omitted.

Figure 21:
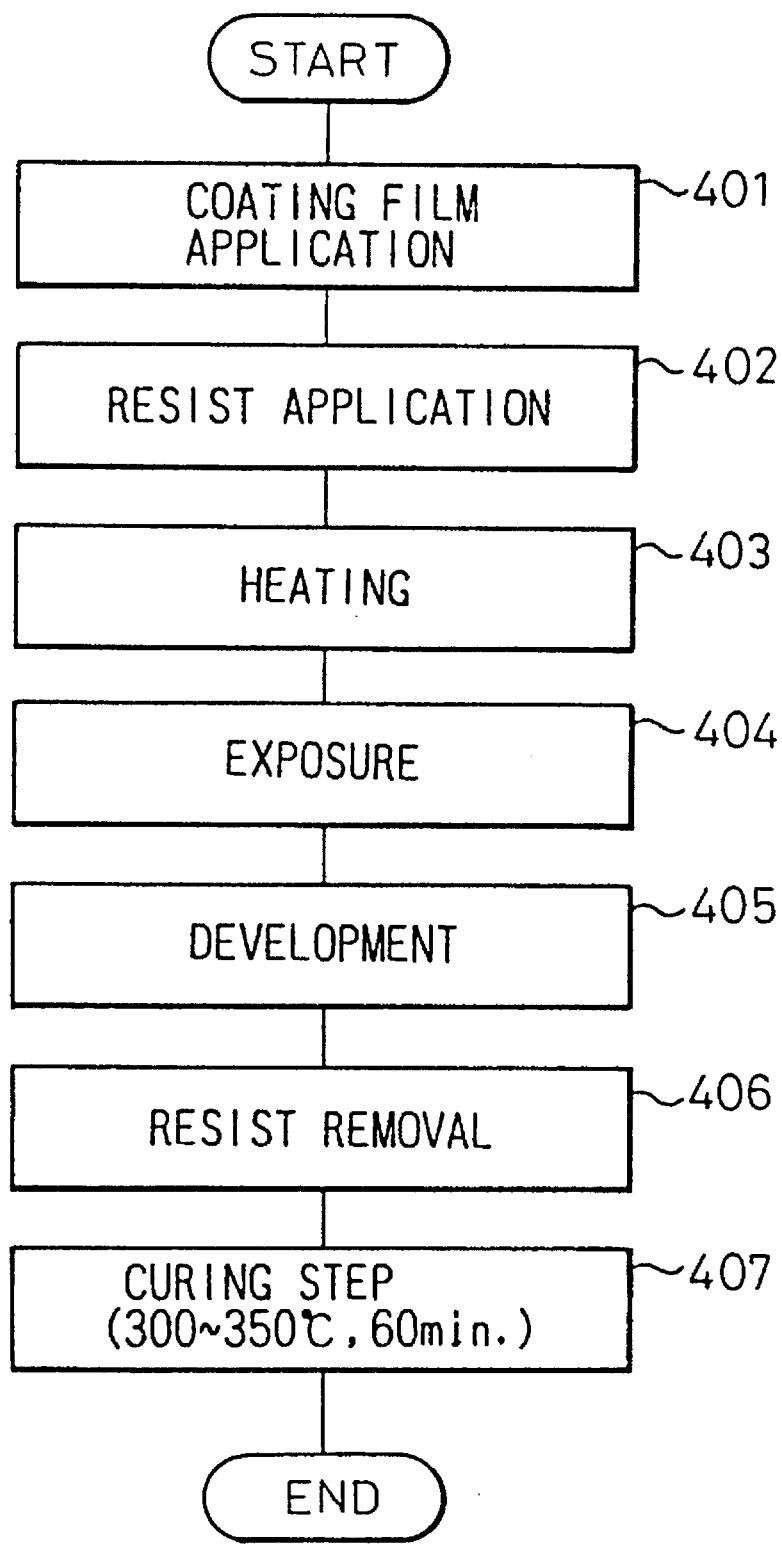
FIG. 21 is a diagram showing a coating film growing process.

For reference purposes, FIG. 21 shows a flowchart for the coating film growing process. In the figure, the curing step in step 407 is a process for drying the grown film, where the devices are held at high temperatures from 300° C. to 350° C. for 60 minutes. This provides conditions very similar to those of aging, so that the coating film growing step can be used to replace the aging step.

In the test method of the second and third embodiments, since the aging step is performed on the semiconductor memory fabricated on a wafer, the memory can be subjected to a high temperature. Furthermore, in the step of forming a coating film that serves as a stress relieving film during assembly, the memory is held at a high temperature for a prescribed period of time which also provides aging conditions. This achieves a reduction in the number of test steps.

In the flash memory, as shown in FIGS. 2 and 4, to detect whether a specific memory cell is conducting or not, the sense amplifier 15 is provided the output level of which varies according to the amount of current flowing on the bit line. This type of sense amplifier is widely used in semiconductor memories, including DRAM, SRAM, and EPROM, that comprise memory cells arranged in a matrix array.

Figure 22:
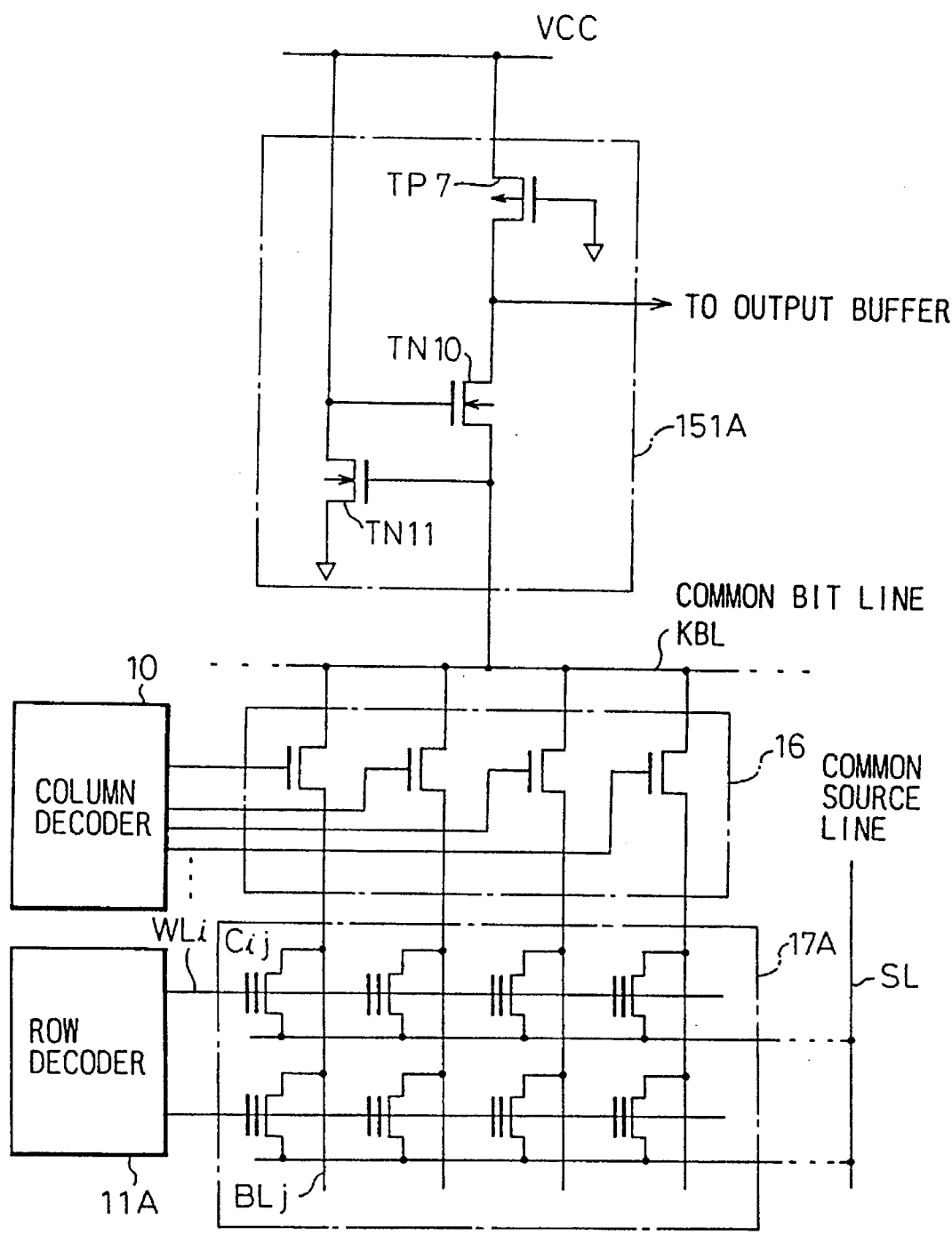
FIG. 22 is a diagram showing an example of a prior art sense amplifier.

FIG. 22 is a diagram showing an example of a prior art sense amplifier. To illustrate how the sense amplifier is connected to the memory cell matting, the Y-gate 16, memory cell matrix 17A, column decoder 10, and row decoder 11A shown in FIG. 2 are also shown here. In the memory cell matrix 17A, a large number of parallel word lines WLi and a large number of parallel bit lines BLj are arranged at right angles to each other, and at each of their intersections is located a transistor, such as shown in FIG. 4, forming a nonvolatile memory cell Cij. The gate of each transistor is connected to the word line, the drain is connected to the bit line, and the source is connected to a common source line SL.

To the word line selected by the row decoder 11A, a higher voltage is applied than to the other word lines, and one gate in the Y-gate 16 is caused to conduct by a signal from the column decoder 10, so that only the selected bit line is connected to a common bit line KBL which connects to the sense amplifier 151A. The sense amplifier 151A then detects whether the memory cell located at the intersection of the selected word line and bit line is conducting or nonconducting. The read operation is accomplished in this manner. The write operation is substantially the same, except that the voltages applied to the word line and bit line are different, and also that the common bit line KBL is connected to the write amplifier, not to the sense amplifier 151A.

The sense amplifier shown in FIG. 22 is generally known as a single-end sense amplifier, and is widely used because of the small number of components required, ease of adjustment, and ease of use.

Figure 23:
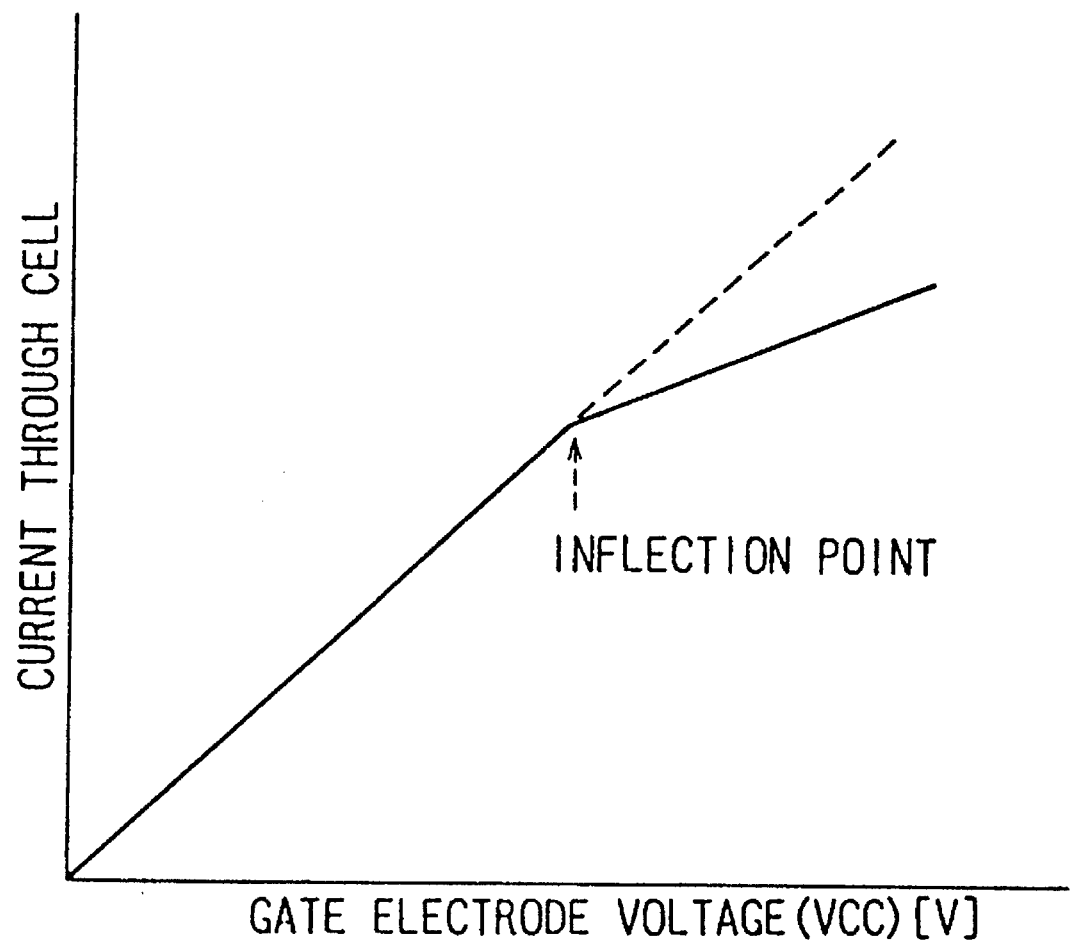
FIG. 23 is a diagram showing the variation of a current through cell as a function of the gate voltage of a memory cell transistor.

As described above, for a semiconductor memory, a power supply margin on the high-voltage side that can be applied to the memory cell needs to be measured. However, the memory cell current characteristic is such that the gradient decreases with increasing gate voltage. FIG. 23 is a diagram showing a relation between a gate electrode voltage of the memory cell and a current through the memory cell. As shown in FIG. 23, the current characteristic of the memory cell has different gradients in two areas divided at a inflection point. Since a sense point of the sense amplifier changes in proportion to a change of a power supply voltage, the sense amplifier shown in FIG. 22 has the problem that the sense point becomes displaced when the supply voltage is increased, which prevents correct cell comparison. To avoid this problem, an extra circuit has to be added so that the sense amplifier power supply can be separated from the cell power supply, and also, a special test fop measuring the power supply has to be added. In the fourth embodiment, this problem is dissolved.

Figure 24:
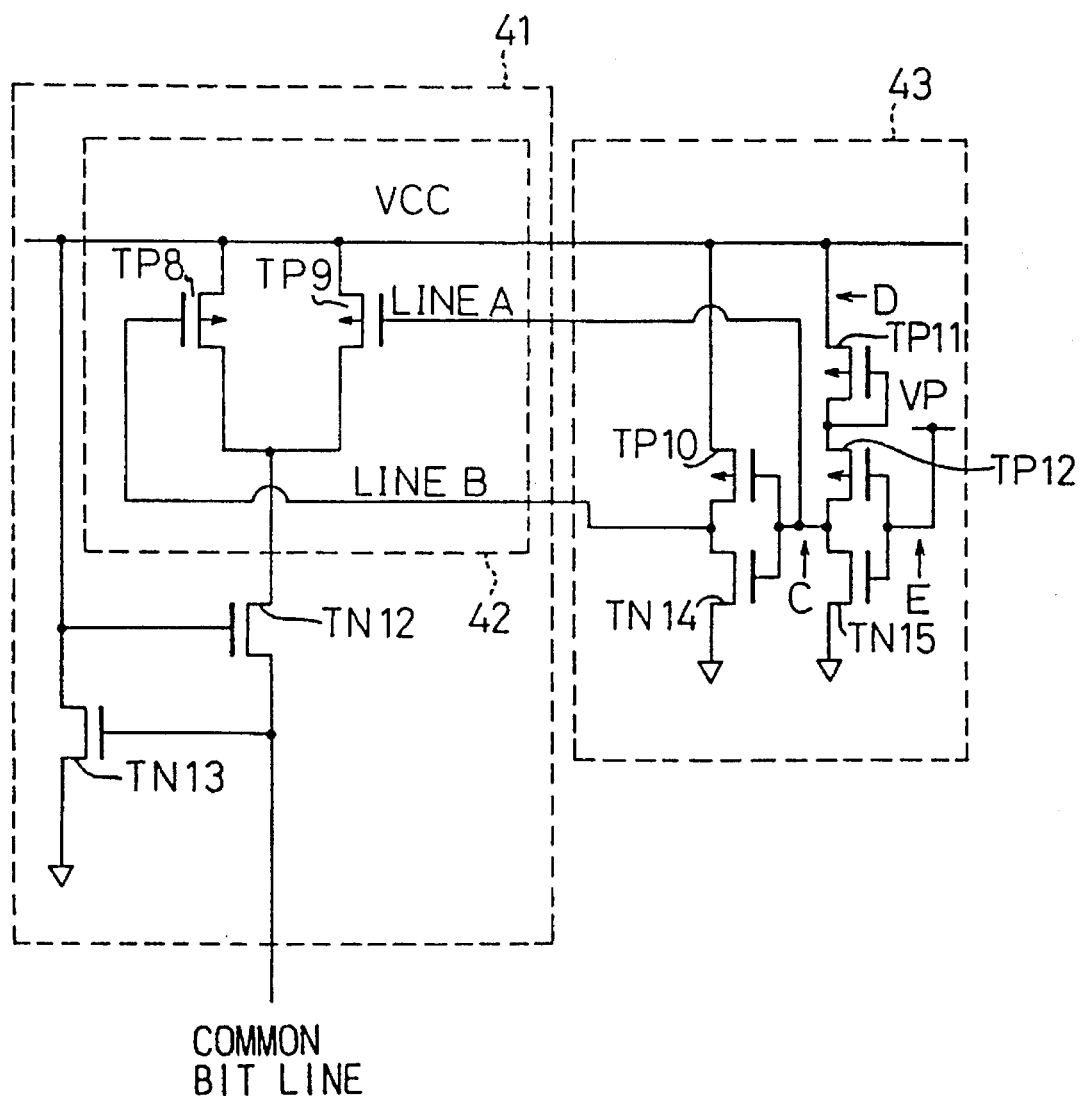
FIG. 24 is a circuit diagram showing a sense amplifier according to a fourth embodiment.

FIG. 24 is a diagram showing the configuration of a sense amplifier according to a fourth embodiment. In this example, the sense amplifier is connected to the common bit line KBL in the flash memory shown in FIG. 8, but it will be appreciated that the application is not limited to the illustrated one but that the sense amplifier shown can be used in other semiconductor devices.

In FIG. 24, the circuit portion indicated at 41 is the sense amplifier, within which the numeral 42 indicates a portion containing load transistors. The numeral 43 designates a VCC supply voltage circuit. This circuit 43 is a conventional high-voltage detection circuit which is designed to output a "High" or "Low" signal at an output point C depending on the difference between a voltage at a power supply terminal D and a voltage at a gate E. In the illustrated example, a voltage VP is applied to the gate E, and by reference to this voltage the magnitude of the voltage VCC is determined (here, the voltage VP is fixed to 5 V). In the illustrated example, when the voltage VCC is in the vicinity of the voltage VF, the line A is "Low" and the line B is "High"; when VCC is sufficiently high compared to VP, then the line A is "High" and the line B is "Low". The outputs of the circuit 43 are connected to the gates of normal-voltage and high-voltage load transistors TP9 and Tp8 in the circuit 41 via the lines A and B, respectively. For normal voltage supply, the line A is "Low" and the line B is "High" so that the normal-voltage load transistor TP9 is ON and the high-voltage load transistor TP8 is OFF, thus enabling normal data comparison. However, when the supply voltage becomes higher than a certain level, the outputs of the supply voltage detection circuit 43 set the line A to "High" and the line B to "Low" so that the normal-voltage load transistor TP9 is OFF and the high-voltage load transistor TP8 is ON, to prevent accurate data comparison from being interfered with.

Figure 25:
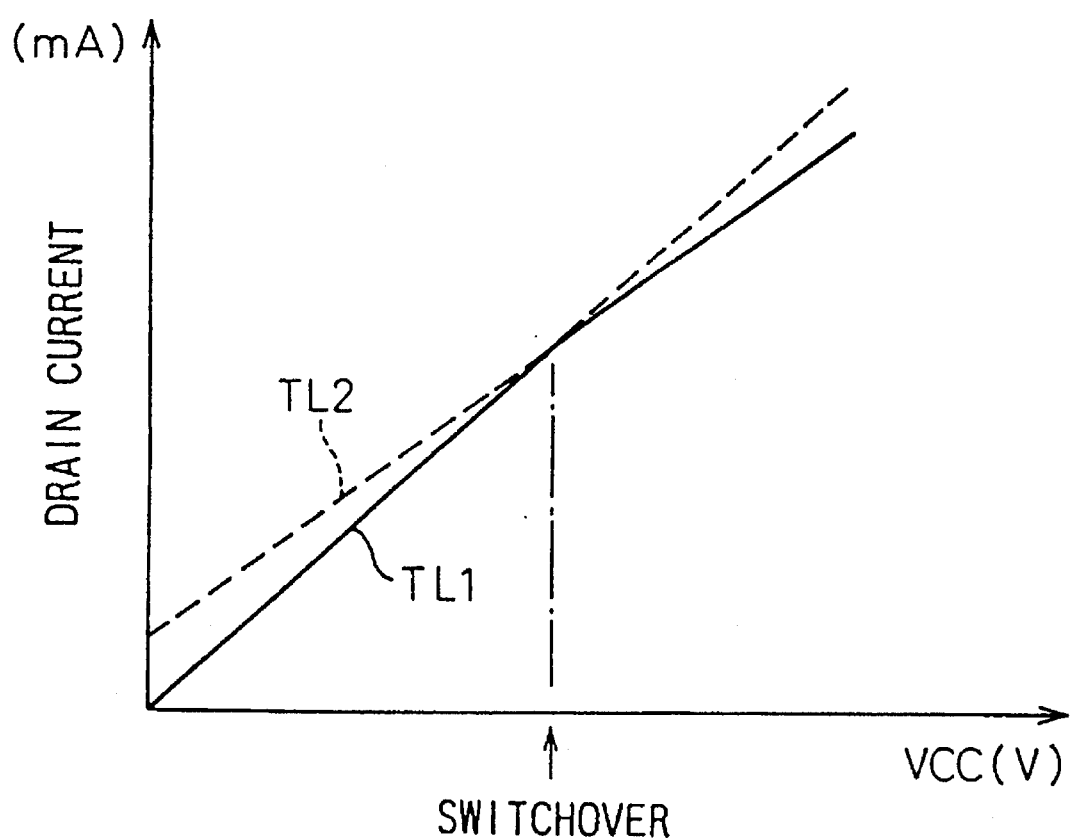
FIG. 25 is a diagram showing the characteristics of the sense amplifier according to the fourth embodiment.

FIG. 25 is a diagram showing the load characteristic of the sense amplifier of FIG. 24. The characteristic slope is different between the normal-voltage load transistor TP9 and the high-voltage load transistor TP8, and by switching from one transistor to the other in the middle, the characteristic of the sense amplifier is modified as shown by the solid line which essentially coincides with the decision level variation shown in FIG. 17. This ensures accurate data comparison even when VCC is a high voltage.

According to the semiconductor memory in the fourth embodiment of the present invention, the sense amplifier includes a plurality of load transistors having different load characteristics, and the load transistors are selectable for connection according to the supply voltage. This ensures accurate cell comparison over the supply voltage ranging from the normal operating voltage to a high voltage.

Figure 26:
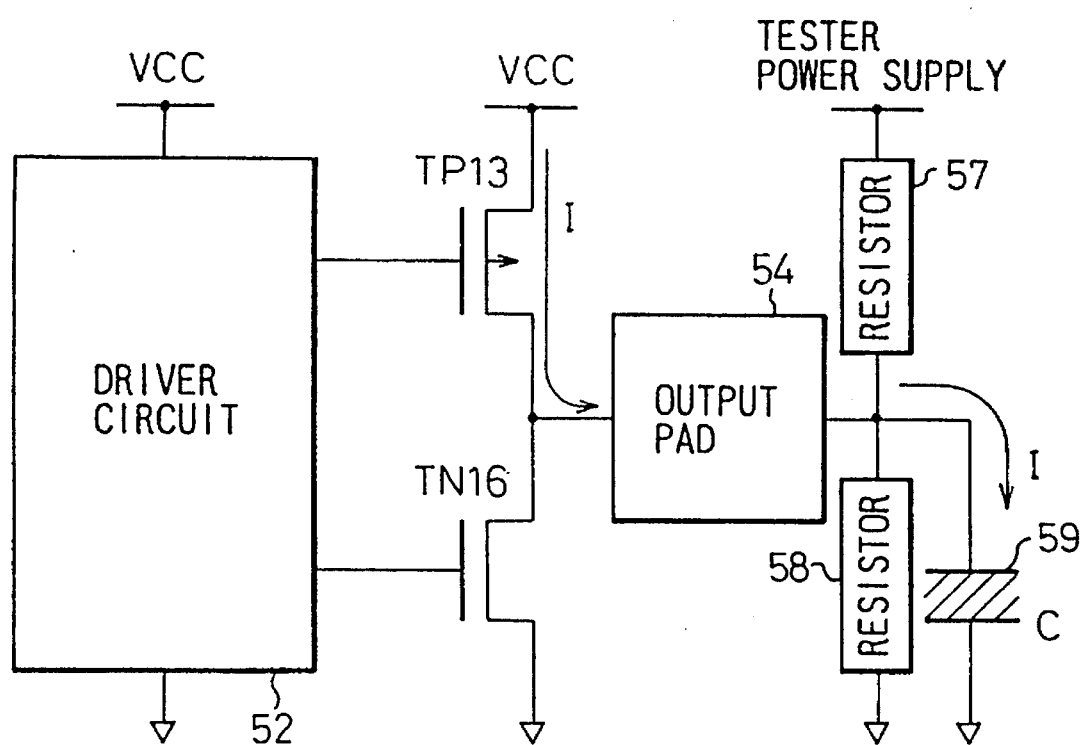
FIG. 26 is a diagram showing a prior art setup for testing power supply current for a semiconductor device.

As described above, for a semiconductor device, the power supply current during operation needs to be measured. Because of the test process employed, the power supply current is measured using a setup such as shown in FIG. 26 with the output pin connected to a load circuit. In FIG. 26, the numeral 52 is a driver circuit; TP13 and TN16 are p-channel and n-channel transistors, respectively, which constitute an output circuit; 54 is an output pad; and 57, 58, and 59 are resistors and a capacitor which constitute the load circuit on the tester side. The measuring conditions for the operating power supply current guaranteed in specifications, etc., require that the current flowing through a load be 0 mA. However, when the measurement is made with the output connected to the load circuit, the correct current value cannot be obtained since the charge/discharge current flowing through the load circuit is also measured. Therefore, when measuring the guaranteed design value, the output pin is disconnected from the measuring circuit.

Furthermore, with the output circuit setup shown in FIG. 26, the power supply current cannot be accurately measured; therefore, the measurement is made after disconnecting the output pin from the measuring circuit. This introduces a cumbersome step in the test process. In the fifth embodiment, these problems are dissolved.

Figure 27:
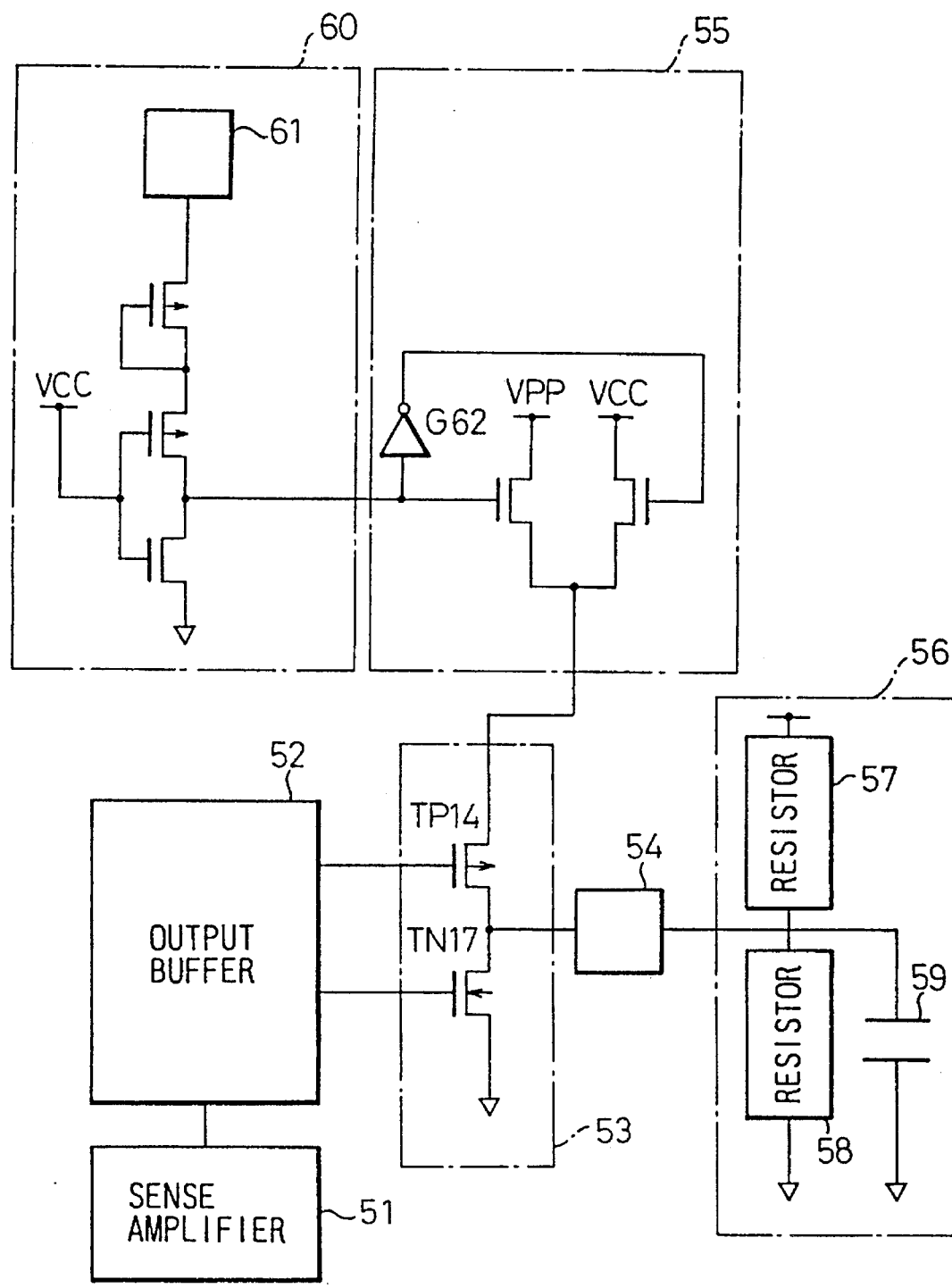
FIG. 27 is a diagram showing the configuration of a fifth embodiment.

FIG. 27 is a diagram showing the configuration of an output circuit in a nonvolatile memory according to a fifth embodiment. As shown, a tester 56 is connected.

In the figure, the numeral 51 is a sense amplifier, and 52 is an outpost buffer. The numeral 53 is an output transistor circuit consisting of an n-channel transistor TN17 and a p-channel transistor TP14, and 54 indicates its output terminal. The numeral 55 is a circuit for selecting the power supply for the output transistor circuit 53; the power supply is selected between the normal-voltage power supply VCC and the high-voltage power supply VPP. The high-voltage power supply VPP is used to supply power for writing and erasure, and is independent of the normal-voltage power supply VCC. The numeral 60 is a select signal generating circuit for generating a select signal for input to the power supply selecting circuit 55. When a high voltage is applied to an electrode pad 61, the signal to the power supply selecting circuit 55 is set to "High", so that VPP is applied to the output transistor circuit 53. As a result, the current flowing from the output transistor circuit 53 to the load circuit consisting of resistors 57, 58 and a capacitor 59 in the tester 56, becomes independent of the power supply VCC, and yet the charging and discharging of the load transistor is performed in a usual manner so that the semiconductor memory operates normally. Under these conditions, the power supply current value is measured.

As described above, in the semiconductor device of the fifth embodiment, the output circuit can be switched between the normal power supply and the independent power supply. Therefore, when measuring the power supply current, the power supply for the output transistors is switched from one power supply to the other. This prevents extra current from flowing to the power supply (VCC) for other circuits, so that the power supply current during operation can be measured accurately, without affecting the device operation.

We claim:

1. A semiconductor device comprising:
    a power supply which includes a normal power supply and an independent power supply provided independently of said normal power supply;
    either of said normal power supply and said independent power supply being selectable as a power supply for an output circuit, wherein said output circuit comprises an output transistor circuit consisting of a P-channel transistor and an N-channel transistor which are serially connected between a first node and a reference voltage line, and a voltage supplied to said first node being selectable.

2. A semiconductor device according to claim 1, further comprising a power supply selecting circuit that outputs a signal for selecting one of said power supplies in accordance with the level of an externally applied signal.

3. A method of detecting a power supply current during operation of a semiconductor device which comprises a power supply including a normal power supply and an independent power supply provided independently of said normal power supply, either of said normal power supply and said independent power supply being selectable as a power supply for an output circuit; and a power supply selecting circuit that outputs a signal for selecting one of said power supplies in accordance with a level of an externally applied signal, said method comprising the steps of:
    applying a signal of such a level as to select said independent power supply; and
    measuring a power supply current of said normal power supply, wherein said output circuit comprises an output transistor circuit consisting of a P-channel transistor and an N-channel transistor which are serially connected between a first node and a reference voltage line, and a voltage supplied to said first node being selectable.

* * * * *